(12) United States Patent
Byun et al.

(10) Patent No.: US 10,560,119 B2
(45) Date of Patent: Feb. 11, 2020

(54) METHOD FOR PERFORMING ENCODING ON BASIS OF PARITY CHECK MATRIX OF LDPC CODE IN WIRELESS COMMUNICATION SYSTEM AND TERMINAL USING SAME

(71) Applicant: LG Electronics Inc., Seoul (KR)

(72) Inventors: Ilmu Byun, Seoul (KR); Jinwoo Kim, Seoul (KR); Kwangseok Noh, Seoul (KR); Jongwoong Shin, Seoul (KR); Bonghoe Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/248,223

(22) Filed: Jan. 15, 2019

(65) Prior Publication Data

US 2019/0245556 A1    Aug. 8, 2019

Related U.S. Application Data

(63) Continuation of application No. PCT/KR2018/004835, filed on Apr. 26, 2018.
(Continued)

(51) Int. Cl.
  *H03M 13/11* (2006.01)
  *H03M 13/00* (2006.01)
  *H04L 1/00* (2006.01)

(52) U.S. Cl.
  CPC ........ *H03M 13/1102* (2013.01); *H03M 13/11* (2013.01); *H03M 13/616* (2013.01); *H04L 1/00* (2013.01); *H04L 1/0041* (2013.01)

(58) Field of Classification Search
  CPC ....................... H03M 13/1102; H03M 13/616
  See application file for complete search history.

(56) References Cited

U.S. PATENT DOCUMENTS 7,793,190 B1 *  9/2010  Gray .................... H03M 13/03
                                                714/752
8,370,700 B2 *  2/2013  Xu ....................... H03M 13/116
                                                714/752
(Continued)

FOREIGN PATENT DOCUMENTS

WO    WO2014117836       8/2014

OTHER PUBLICATIONS

Jiang et al., "An Improved Variable Length Coding Scheme Using Structured LDPC Codes," 2010 International Conference on Wireless Communications & Signal Processing, Oct. 21-23, 2010, p. 1-5.
(Continued)

*Primary Examiner* — Joseph D Torres
(74) *Attorney, Agent, or Firm* — Fish & Richardson P.C.

(57) ABSTRACT

A method for performing encoding on the basis of a parity check matrix of a LDPC code, according to one embodiment of the present invention, comprises the steps of: generating, by a terminal, a parity check matrix, wherein the parity check matrix corresponds to a characteristic matrix, each element of the characteristic matrix corresponds to a shift index value determined by a modulo operation between a corresponding element in a base matrix and a lifting value, and the base matrix is a 46×68 matrix; and performing, by the terminal, encoding of input data by using the parity check matrix, wherein the lifting value is associated with the length of the input data.

19 Claims, 11 Drawing Sheets

Related U.S. Application Data

(60) Provisional application No. 62/524,588, filed on Jun. 25, 2017.

(56) References Cited

U.S. PATENT DOCUMENTS

| | | | |
|---|---|---|---|
| 9,548,759 B1 | 1/2017 | Rad | |
| 2005/0289437 A1* | 12/2005 | Oh | H03M 13/1148 |
| | | | 714/758 |
| 2006/0206781 A1* | 9/2006 | Choi | H03M 13/1102 |
| | | | 714/758 |
| 2009/0132886 A1* | 5/2009 | Oh | H03M 13/116 |
| | | | 714/752 |
| 2011/0239075 A1* | 9/2011 | Xu | H03M 13/116 |
| | | | 714/751 |
| 2014/0365844 A1* | 12/2014 | Kliger | H03M 13/116 |
| | | | 714/758 |
| 2016/0094245 A1 | 3/2016 | Landau et al. | |

OTHER PUBLICATIONS

Myung et al., "Lifting Methods for Quasi-Cyclic LDPC Codes," IEEE Communications Letters, Jun. 2006, 10 (6):489-491.

LG Electronics, "LDPC Codes Design for eMBB," R1-1706157, 3GPP TSG RAN WG1 #88bis, Spokane, USA, Apr. 3-7, 2017, 7 pages.

Nokia, Alcatel-Lucent Shanghai Bell, "LDPC design for eMBB," R1-1705857, 3GPP TSG RAN WG1 #88bis Meeting, Spokane, WA, USA, Apr. 3-7, 2017, 7 pages.

LG Electronics, "LDPC Codes Design for eMBB data channel," R1-1707672, 3GPP TSG RAN WG1 #89, Hangzhou, China, May 15-19, 2017, 6 pages.

Nokia, Alcatel-Lucent Shanghai Bell, "LDPC codes for control channels," R1-1609592, 3GPP TSG-RAN WG1 #86bis, Lisbon, Portugal, Oct. 10-14, 2016, 7 pages.

\* cited by examiner

FIG. 2

$$P\_1 = \begin{bmatrix} 0 & 1 & 0 & \cdots & 0 \\ 0 & 0 & 1 & & 0 \\ \vdots & & & \ddots & \vdots \\ 0 & 0 & 0 & \cdots & 1 \\ 1 & 0 & 0 & \cdots & 0 \end{bmatrix}$$

FIG. 3

$$H = \begin{bmatrix} P\_a\ 1,1 & P\_a\ 1,2 & \cdots & P\_a\ 1,(n-1) & P\_a\ 1,n \\ P\_a\ 2,1 & P\_a\ 2,2 & & P\_a\ 2,(n-1) & P\_a\ 2,n \\ \vdots & & \ddots & & \vdots \\ P\_a\ m,1 & P\_a\ m,2 & \cdots & P\_a\ m,(n-1) & P\_a\ m,n \end{bmatrix}$$

FIG. 4

$$H_C = \begin{bmatrix} a\,1,1 & a\,1,2 & \cdots & a\,1,(n-1) & a\,1,n \\ a\,2,1 & a\,2,2 & & a\,2,(n-1) & a\,2,n \\ \vdots & & \ddots & & \vdots \\ a\,m,1 & a\,m,2 & \cdots & a\,m,(n-1) & a\,m,n \end{bmatrix}$$

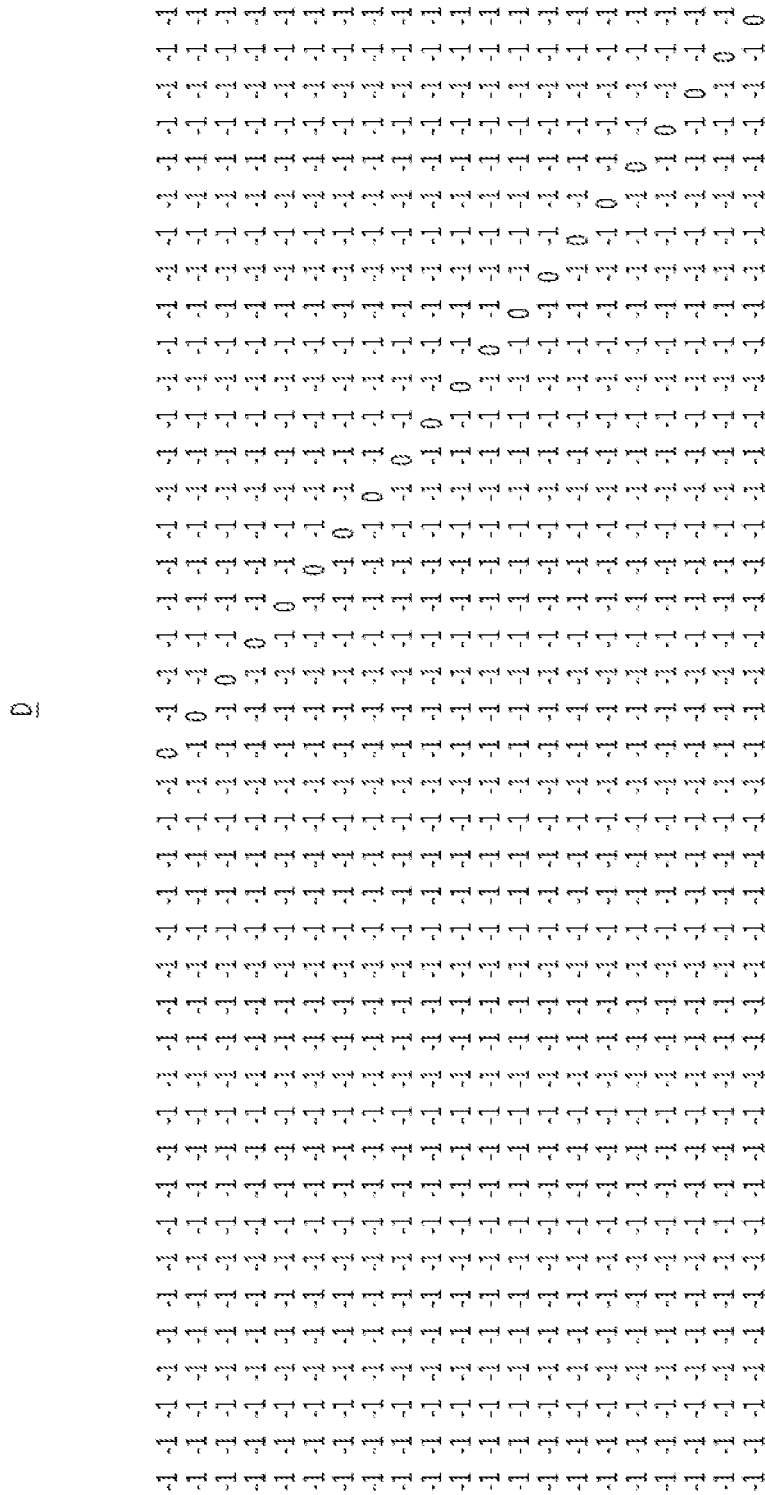

METHOD FOR PERFORMING ENCODING ON BASIS OF PARITY CHECK MATRIX OF LDPC CODE IN WIRELESS COMMUNICATION SYSTEM AND TERMINAL USING SAME

CROSS-REFERENCE TO RELATED APPLICATIONS

This application is a continuation of International Application No. PCT/KR2018/004835, filed on Apr. 26, 2018, which claims the benefit of U.S. Provisional Application No. 62/524,588, filed on Jun. 25, 2017. The disclosures of the prior applications are incorporated by reference in their entirety.

TECHNICAL FIELD

The present disclosure relates to wireless communication and, more particularly, to a method of performing encoding based on a parity check matrix of an LDPC code in a wireless communication system and a user equipment using the same.

BACKGROUND ART

A conventional low-density parity-check (LDPC) encoding method has been used in wireless communication systems such as an IEEE 802.11n wireless local area network (WLAN) system, an IEEE 802.16e mobile WiMAX system, and a DVB-S2 system. The LDPC encoding method is basically a type of linear block code and, therefore, operation of the LDPC encoding method is performed by multiplication of a parity check matrix by an input vector.

It is predicted that data transmission for fifth generation (5G) communication will support from a maximum of 20 Gbps to a minimum of a few tens of bps (e.g., 40 bits in the case of LTE). To support wide coverage of data transmission, necessity of supporting various code rates is increasing. To meet such a requirement, various encoding methods based on an LDPC code are under discussion.

DETAILED DESCRIPTION OF THE INVENTION

Technical Problems

An object of the present disclosure is to provide a method of performing encoding and a user equipment using the same, based on a parity check matrix of an LDPC code designed to acquire high throughput in transmission of a large block with a relatively long length.

Technical Solutions

According to an aspect of the present disclosure, provided herein is a method of performing encoding based on a parity check matrix of a low-density parity-check (LDPC) code, including generating the parity check matrix by a user equipment, wherein the parity check matrix corresponds to a characteristic matrix, each element of the characteristic matrix corresponds to a shift index value determined by a modulo operation between a corresponding element in a base matrix and a lifting value, and the base matrix is a 46×68 matrix; and performing encoding on input data using the parity check matrix by the user equipment, wherein the lifting value is associated with the length of the input data.

Advantageous Effects

According to an embodiment of the present disclosure, there are provided a method of performing encoding and a user equipment using the same, based on a parity check matrix of an LDPC code designed to acquire high throughput in transmission of a large block with a relatively long length.

DESCRIPTION OF DRAWINGS

FIG. 2 is a diagram referenced to explain characteristics of a submatrix P.

FIG. 3 is a diagram illustrating a parity check matrix according to an embodiment of the present disclosure.

FIG. 4 is a diagram illustrating a characteristic matrix corresponding to a parity check matrix according to an embodiment of the present disclosure.

FIG. 6 illustrates a matrix A belonging to a base matrix according to an embodiment of the present disclosure.

FIGS. 7A and 7B illustrate a matrix C belonging to a base matrix according to an embodiment of the present disclosure.

FIGS. 8A and 8B illustrate a matrix C belonging to a base matrix according to an embodiment of the present disclosure.

BEST MODE FOR CARRYING OUT THE INVENTION

The above-described characteristics and the following detailed description are merely exemplary details that are given to facilitate the description and understanding of this disclosure. More specifically, this disclosure may be implemented in another format without being restricted only to the exemplary embodiment presented herein. The following exemplary embodiments are merely examples that are given to fully disclose this disclosure and to describe this disclosure to anyone skilled in the technical field to which this disclosure pertains. Accordingly, if plural methods for implementing the elements of the present disclosure exist, it should be clarified that this disclosure can be implemented by any one specific or similar method.

In this disclosure, if a structure is described as including specific elements, or if a procedure is described as including specific process steps, this indicates that other elements or other process steps may be further included. More specifically, it will be apparent that the terms used in this disclosure are merely given to describe a specific exemplary embodiment of the present invention and that such terms will not be used to limit the concept or idea of this disclosure. Furthermore, it will also be apparent that the examples given to facilitate the understanding of the invention also include complementary embodiments of the given examples.

Each of the terms used in this disclosure is given a meaning that can be generally understood by anyone skilled in the technical field to which this disclosure pertains. Each of the terms that are generally used herein should be understood and interpreted by its uniform meaning in accordance with the context of this disclosure. Moreover, the terms used in this disclosure should not be interpreted as excessively ideal or formal meaning unless otherwise defined clearly. The appended drawings are given to describe the exemplary embodiment of this disclosure.

Figure 1:
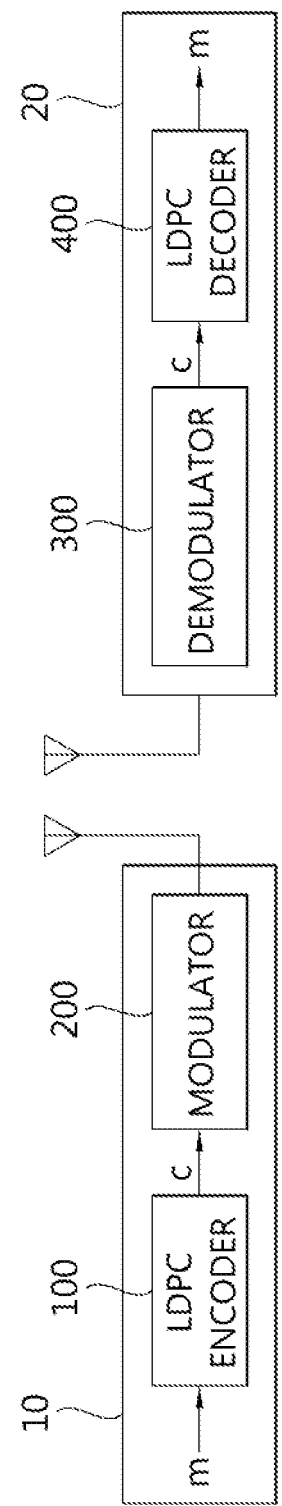
FIG. 1 is a block diagram of a wireless communication system according to an embodiment of the present disclosure.

FIG. 1 is a block diagram of a wireless communication system according to an embodiment of the present disclosure.

Referring to FIG. 1, the wireless communication system may include a transmission user equipment (UE) 10 and a reception UE 20.

The transmission UE 10 may include an LDPC encoder 100 and a modulator 200. The LDPC encoder 100 may receive data m, encode the received data m, and output a codeword c. The modulator 200 may receive the codeword c and perform radio modulation on the received codeword c. The radio modulated codeword may be transmitted to the reception UE 20 through an antenna.

It may be appreciated that a processor (not shown) of the transmission UE 10 includes the LDPC encoder 100 and the modulator 200 and is connected to the antenna of the transmission UE 10.

The reception UE 20 may include a demodulator 300 and an LDPC decoder 400. The demodulator 300 may receive the radio modulated codeword through an antenna and demodulate the radio modulated codeword into the codeword c. The LDPC decoder 400 may receive the codeword c, decode the codeword c, and output the data m.

It may be appreciated that a processor (not shown) of the reception UE 20 includes the demodulator 300 and the LDPC decoder 400 and is connected to the antenna of the reception UE 20.

In other words, the wireless communication system of FIG. 1 may encode the data m into the codeword c using the LDPC encoder 100 and decode the codeword c into the data m using the LDPC decoder 400.

Thereby, the data may be stably transmitted and received between the transmission UE 10 and the reception UE 20. An LDPC encoding method and decoding method according to the present embodiment may be performed based on a parity check matrix H.

In the present disclosure, the data m may be referred to as input data. The parity check matrix H may represent a matrix for checking whether an error is included in the codeword c received by the LDPC decoder 400. The parity check matrix H may be prestored in a memory (not shown) of each of the transmission UE 10 and the reception UE 20.

Hereinafter, embodiments of the present disclosure will be described on the premise that a quasi-cyclic LDPC code is applied. The parity check matrix H may include a plurality of sub-matrices P. Each submatrix P may be a zero matrix O, or a circulant matrix acquired by shifting an identity matrix I.

To encode data from a general linear block code, a generate matrix G is needed. According to the above assumption, since the present embodiment is based on a quasi-cyclic LDPC method, the LDPC encoder 100 may encode the data m into the codeword c using the parity check matrix H without an additional generate matrix G.

The LDPC encoder 100 may encode the data m into the codeword c using the parity check matrix H.

$$c = [m\ p]$$ Equation 1

Referring to Equation 1, the codeword c generated by the LDPC encoder 100 may be divided into the data m and a parity bit p.

For example, the data m may correspond to a set of binary data $[m\_0, m\_1, m\_2, \ldots, m\_K{-}1]$. That is, it may be understood that the length of the data m to be encoded is K.

For example, the parity bit p may correspond to a set of binary data $[p\_0, p\_1, p\_2, \ldots, p\_N{+}2Zc{-}K{-}1]$. That is, it may be understood that the length of the parity bit p is N+2Zc-K. In this case, N may be 66Zc (i.e., N=66Zc). Zc will be described later in detail with reference to the drawings.

From the viewpoint of the LDPC encoder 100, the parity bit p for encoding the data m may be derived using the parity check matrix H.

Additionally, it may be assumed that, on a channel coding chain, initial data of a transport block size (hereinafter, "TBS") exceeding a preset threshold size (i.e., Kcb, for example, 8448 bits) is received from a higher layer.

In this case, the initial data may be divided into at least two data depending on the length K of data (where K is a natural number) to be encoded. In other words, the length K of the data m may be understood as a code block size (CBS).

Meanwhile, the LDPC decoder 400 may determine whether an error is present in the received codeword c based on the parity check matrix H. Whether an error is present in the received codeword c may be checked by the LDPC decoder 400 based on Equation 2.

$$H \cdot c^T = 0$$ Equation 2

As indicated in Equation 2, when multiplication of the parity check matrix H by a transposed matrix of the codeword c is '0', the codeword c received by the reception UE 20 may be determined not to include an error value.

When the multiplication of the parity check matrix H by the transposed matrix of the codeword c is not '0', the codeword c received by the reception UE 20 may be determined to include an error value.

FIG. 2 is a diagram referenced to explain characteristics of a submatrix P.

Referring to FIGS. 1 and 2, the parity check matrix H may include a plurality of sub-matrices P_y (where y is an integer). In this case, it may be appreciated that each submatrix P_y is a matrix acquired by shifting an identity matrix I having a size of Zc×Zc to the right by a specific value y.

Specifically, since the subscript y of a submatrix P_1 of FIG. 2 is '1', the submatrix P_1 may be understood as a matrix obtained by shifting all elements included in the identity matrix I having a size of Zc×Zc to the right by one column. For reference, in this disclosure, Zc may be referred to as a lifting value.

Although not shown in FIG. 2, since the subscript y of a submatrix P_0 is '0', the submatrix P_0 may be understood as the identity matrix I having a size of Zc×Zc.

In addition, since the subscript y of a submatrix P_-1 is '-1', the submatrix P_-1 may be understood as a zero matrix having a size of Zc×Zc.

FIG. 3 is a diagram illustrating a parity check matrix according to an embodiment of the present disclosure.

Referring to FIGS. 1 to 3, one submatrix P_am,n may be defined at every location m,n by each row m (where m is a natural number of 1 to 46) and each column n (where n is a natural number of 1 to 68) of the parity check matrix H of FIG. 3.

The subscript (i.e., am,n) corresponding to the defined location m,n of the parity check matrix H of FIG. 3 is set to an integer value and may be referred to as a shift index value.

Each submatrix P_am,n of FIG. 3 may be understood as a matrix obtained by shifting the identity matrix I having a size of Zc×Zc to the right by the shift index value am,n corresponding to the location (m,n). That is, an actual size of the parity check matrix H of FIG. 3 may be understood as (m×Zc)×(n×Zc).

The lifting value Zc according to the present embodiment may be any one of 7, 14, 28, 56, 112, and 224.

FIG. 4 is a diagram illustrating a characteristic matrix corresponding to a parity check matrix according to an embodiment of the present disclosure.

Referring to FIGS. 1 to 4, elements (i.e., a1,1 to am,n) according to the location m,n determined by each row m (where m is a natural number of 1 to 46) and each column n (where n is a natural number of 1 to 68) of the characteristic matrix Hc of FIG. 4 may be set as shift index values at corresponding locations of the parity check matrix H of FIG. 3.

That is, the parity check matrix H of FIG. 3 may be obtained by the elements according to the location m,n of the characteristic matrix Hc of FIG. 4 and the preset lifting value Zc.

The element am,n of the characteristic matrix Hc of FIG. 4 may be defined as indicated below in Equation 3.

$$am,n = \begin{cases} Vm,n & \text{if } Vm,n < 0 \\ \mod(Vm,n, Zc), & \text{otherwise} \end{cases} \quad \text{Equation 3}$$

The lifting value Zc in Equation 3 may be any one of 7, 14, 28, 56, 112, and 224. A process of determining the lifting value Zc will be described later. In Equation 3, Vm,n may be an element of a corresponding location m,n in a base matrix (hereinafter 'Hb') which will be described later.

For example, it may be assumed that the shift index value am,n corresponding to the location m,n of the parity check matrix H, obtained by Equation 3, is equal to or greater than '1'.

In this case, the submatrix P_am,n corresponding to the location m,n of FIG. 3 may be understood as a matrix obtained by shifting all elements included in the identity matrix I having a size of Zc×Zc (where Zc is a natural number) to the right by the shift index value (i.e., am,n) corresponding to the location (m,n) of FIG. 3.

As another example, it may be assumed that the shift index value am,n corresponding to the location m,n of the parity check matrix H, obtained by Equation 3, is '0'. In this case, the submatrix P_am,n corresponding to the location m,n of FIG. 3 may correspond to the identity matrix I having a size of Zc×Zc (where Zc is a natural number).

For reference, the case in which the shift index value am,n is '0' may be understood as the case in which an element Vm,n of a base matrix Hb, which will be described later, is '0'.

As still another example, it may be assumed that the shift index value am,n corresponding to the location m,n of the parity check matrix H, obtained by Equation 3, is '−1'. In this case, the submatrix P_am,n corresponding to the location m,n of FIG. 3 may be replaced with a zero matrix having a size of Zc×Zc.

For reference, the case in which the shift index value am,n is '−1' may be understood as the case in which the element Vm,n of the base matrix Hb, which will be described later, is '−1'.

Figure 5:
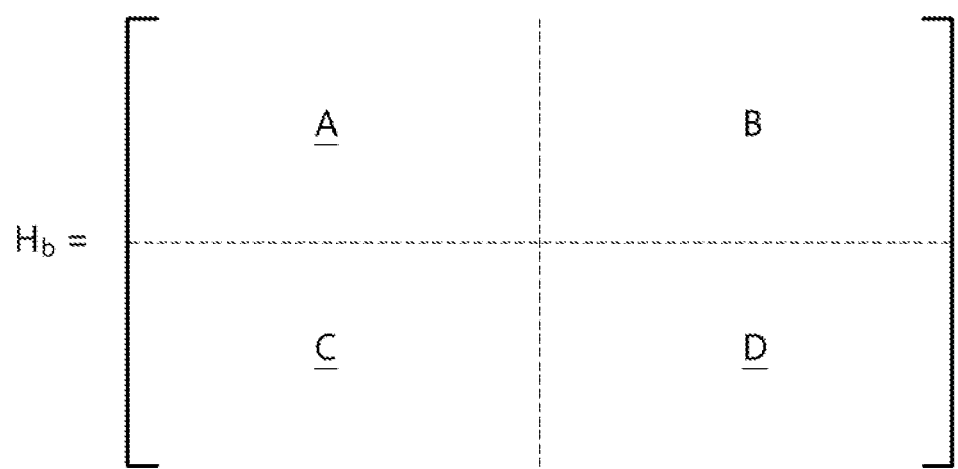
FIG. 5 is a diagram illustrating the structure of a base matrix for a parity check matrix according to an embodiment of the present disclosure.

FIG. 5 is a diagram illustrating the structure of a base matrix for a parity check matrix according to an embodiment of the present disclosure.

Referring to FIGS. 1 to 5, the parity check matrix H of FIG. 3 may be generated based on the characteristic matrix Hc of FIG. 4 and the lifting value Zc. The characteristic matrix Hc of FIG. 4 may be acquired through operation of Equation 3 based on the base matrix Hb of FIG. 5 and the lifting value Zc.

Referring to FIGS. 1 to 5, the base matrix Hb of FIG. 3 according to the present embodiment may include 4 submatrices A, B, C, and D.

The size of the base matrix Hb according to the present embodiment may be 46×68. A predetermined element Vm,n may be disposed at every location m,n defined by each row m (where m is a natural number of 1 to 46) and each column n (where n is a natural number of 1 to 68) of the base matrix Hb.

The matrix A of FIG. 5 may include a plurality of elements corresponding to 1st to 27th columns of the base matrix Hb in 1st to 5th rows of the base matrix Hb. The matrix A will be described later in detail with reference to FIG. 6.

The matrix B of FIG. 5 may include elements corresponding to 28th to 68th columns of the base matrix Hb in the 1st to 5th rows of the base matrix Hb, which are all '−1'.

The matrix C of FIG. 5 may include a plurality of elements corresponding to the 1st to 27th columns of the base matrix Hb in 6th to 46th rows of the base matrix Hb. The matrix C will be described later in detail with reference to FIGS. 7A and 7B.

The matrix D of FIG. 5 may include a plurality of elements corresponding to the 28th to 68th columns of the base matrix Hb in the 6th to 46th rows of the base matrix Hb. The matrix D will be described later in detail with reference to FIGS. 8A and 8B.

In addition, elements corresponding to a plurality of specific predetermined columns of the base matrix Hb may be punctured. For example, elements corresponding to the 1st and 2nd columns of the base matrix Hb may be punctured.

Hereinafter, respective elements Vm,n of the matrices A, B, C, and D belonging to the base matrix Hb will be described in detail with reference to subsequent drawings.

FIG. 6 illustrates a matrix A belonging to a base matrix according to an embodiment of the present disclosure.

Referring to FIGS. 1 to 6, elements Vm,n corresponding to 1st to 27th columns (n=1, . . . , 27) of the base matrix Hb in the 1st row (m=1) of the matrix A belonging to the base matrix Hb may be {223, 16, 94, 91, −1, 74, 10, −1, −1, 0, 205, 216, 21, 215, −1, 14, 70, −1, 141, 198, 104, 81, 1, 0, −1, −1, −1}.

Elements Vm,n corresponding to the 1st to 27th columns (n=1, . . . , 27) of the base matrix Hb in the 2nd row (m=2) of the matrix A belonging to the base matrix Hb may be 1141, −1, 45, 151, 46, 119, −1, 157, 133, 87, −1, 206, 93, −1, 79, 9, 118, 194, −1, 31, −1, 187, 0, 0, 0, −1, −11.

Elements Vm,n corresponding to the 1st to 27th columns (n=1, . . . , 27) of the base matrix Hb in the 3rd row (m=3) of the matrix A belonging to the base matrix Hb may be {207, 203, 31, −1, 176, 180, 186, 95, 153, 177, 70, −1, −1, 77, 214, 77, −1, 198, 117, 223, 90, −1, −1, 0, 0, −1}.

Elements Vm,n corresponding to the 1st to 27th columns (n=1, . . . , 27) of the base matrix Hb in the 4th row (m=4) of the matrix A belonging to the base matrix Hb may be {201, 18, −1, 165, 5, −1, 45, 142, 16, −1, 34, 155, 213, 147, 69, −1, 96, 74, 99, −1, 30, 158, 1, −1, −1, 0, −1}.

Elements Vm,n corresponding to the 1st to 27th columns (n=1, . . . , 27) of the base matrix Hb in the 5th row (m=5) of the matrix A belonging to the base matrix Hb may be {170, 10, −1, −1, −1, −1, −1, −1, −1, −1, −1, −1, −1, −1, −1, −1, −1, −1, −1, −1, −1, −1, −1, −1, −1, −1, 0}.

Referring to FIG. 6, a plurality of columns corresponding to the 1st to 22nd columns (n=1, . . . ) of the matrix A 600 may be referred to as information columns. The number Kb of information columns of the base matrix Hb according to the present embodiment may be 22.

The number Kb of information columns may be associated with the length K of input data (e.g., m in FIG. 1) to be encoded and the lifting value Zc as indicated in Equation 4.

In Equation 4, the lifting value Zc may be any one of 7, 14, 28, 56, 112, and 224. In the present disclosure, the lifting value Zc may be a value commonly used in the base matrix Hb.

$$Zc = K/Kb \quad \text{Equation 4}$$

Referring to Equation 4, the length K of the input data (e.g., m in FIG. 1) to be encoded in the present disclosure may be 154, 308, 616, 1232, or 4928 bits.

For reference, an example of determining the lifting value Zc will now be described with reference to FIGS. 3 and 4, Equations 5 and 6, and Table 1.

$$Kb \cdot Zc \geq K+ \quad \text{Equation 5}$$

In Equation 5, the lift value Zc may be determined as the smallest value among candidates Z of Table 1 shown below satisfying Equation 5.

TABLE 1

| Set Index (SI) | Set of Lifting Sizes (Z) |
|---|---|
| 1 | 2, 4, 8, 16, 32, 64, 128, 256 |
| 2 | 3, 6, 12, 24, 48, 96, 192, 384 |
| 3 | 5, 10, 20, 40, 80, 160, 320 |
| 4 | 7, 14, 28, 56, 112, 224 |
| 5 | 9, 18, 36, 72, 144, 288 |
| 6 | 11, 22, 44, 88, 176, 352 |
| 7 | 13, 26, 52, 104, 208 |
| 8 | 15, 30, 60, 120, 240 |

In addition, in Equation 5, the number Kb of information columns is 22 and K+ may be defined as indicated below in Equation 6.

$$K+ = \lceil B'+C \rceil \quad \text{Equation 6}$$

According to Equation 6, K+ may be a value obtained by rounding up a quotient of dividing B' by C to the nearest integer. In Equation 6, B' may be a value obtained by adding a preset number for a plurality of cyclic redundancy check (CRC) bits to a transport block size (TBS) of initial data received from a higher layer.

In Equation 6, C may be the number of multiple input data obtained by splitting the initial data of the TBS received from the higher layer.

For example, the initial data of the TBS exceeding a preset threshold size (e.g., 8448 bits) may be split based on the threshold size (e.g., 8448 bits). That is, the initial data of one TBS may be split into multiple input data based on the threshold size (e.g., 8448 bits).

More specifically, assuming that the TBS is '9001', B' may be '9025' by adding the TBS '9001' to the preset number '24' for multiple CRC bits. The TBS '9001' exceeds the threshold size (e.g., 8448 bits) but is less than double (16896 bits) the threshold size (e.g., 8448 bits). Therefore, the initial data of the TBS may be split into two input data. That is, K+ may be set to 4513 obtained by rounding up 4512.5 to the nearest integer. When K+ is set to 4513, candidates Z may be 224, 240, 256, 288, 320, 352, and 384 according to Equation 5 and Table 1. As a result, Zc may be determined as '224' according to the example.

Referring to Equation 4, if the TBS is '9001', it may be understood that the length K of the input data (e.g., m in FIG. 1) to be encoded is determined as '4928' bits.

In the present disclosure, a description is given based on the case in which a set index SI of Table 1 is '4'. In the present disclosure, the lifting value Zc may be any one of 7, 14, 28, 56, 112, and 224 as a value commonly used in the base matrix Hb.

For reference, the above-mentioned matrix A may be represented as shown below in Table 2.

TABLE 2

| 223 | 16 | 94 | 91 | −1 | 74 | 10 | −1 | −1 | 0 | 205 | 216 | 21 | 215 | −1 | 14 | 70 | −1 | 141 | 198 | 104 | 81 | 1 | 0 | −1 | −1 | −1 |
| 141 | −1 | 45 | 151 | 46 | 119 | −1 | 157 | 133 | 87 | −1 | 206 | 93 | −1 | 79 | 9 | 118 | 194 | −1 | 31 | −1 | 187 | 0 | 0 | 0 | −1 | −1 |
| 207 | 203 | 31 | −1 | 176 | 180 | 186 | 95 | 153 | 177 | 70 | −1 | −1 | 77 | 214 | 77 | −1 | 198 | 117 | 223 | 90 | −1 | −1 | −1 | 0 | 0 | −1 |
| 201 | 18 | −1 | 165 | 5 | −1 | 45 | 142 | 16 | −1 | 34 | 155 | 213 | 147 | 69 | −1 | 96 | 74 | 99 | −1 | 30 | 158 | 1 | −1 | −1 | 0 | −1 |
| 170 | 10 | −1 | −1 | −1 | −1 | −1 | −1 | −1 | −1 | −1 | −1 | −1 | −1 | −1 | −1 | −1 | −1 | −1 | −1 | −1 | −1 | −1 | −1 | −1 | −1 | 0 |

Figure 7A:
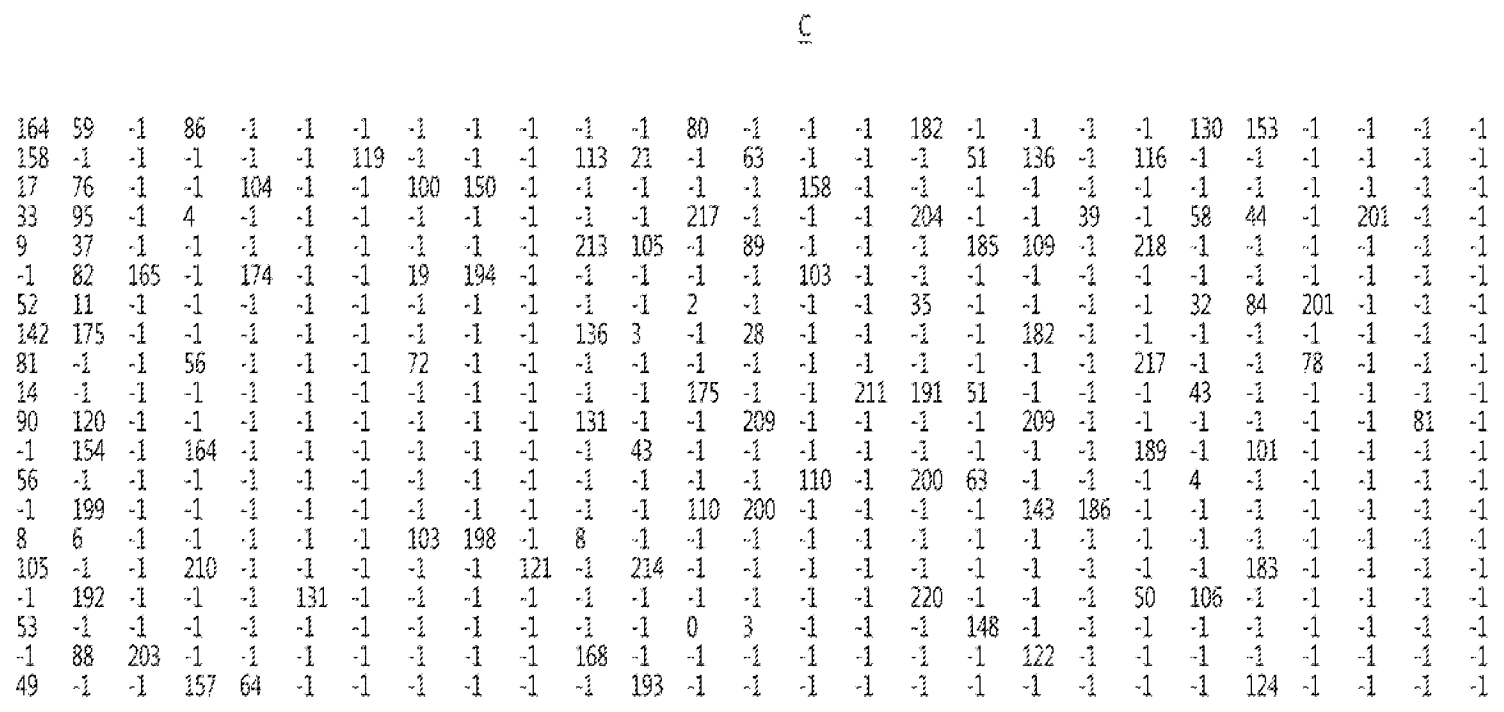
Figure 7B:
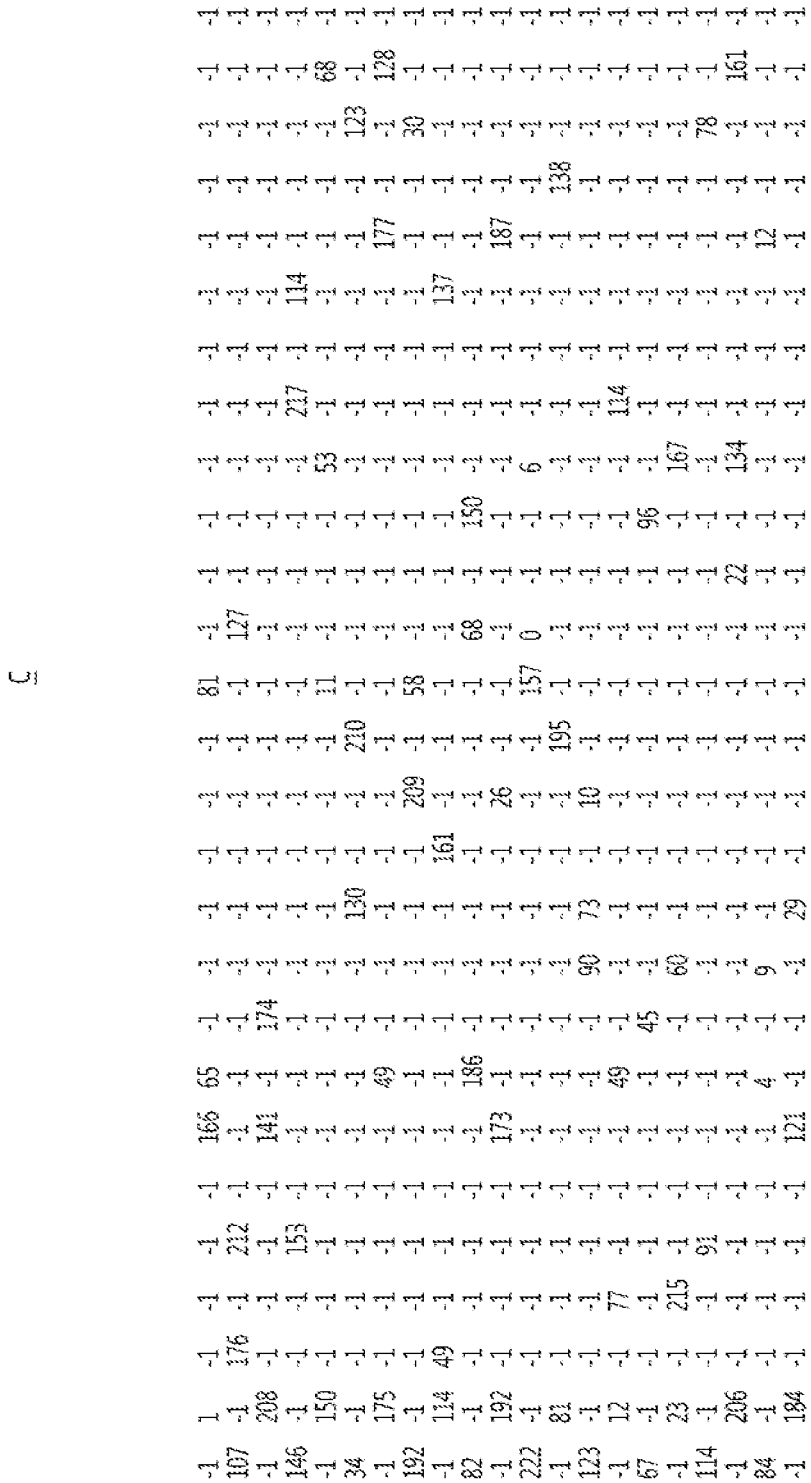

FIGS. 7A and 7B illustrate a matrix C belonging to a base matrix according to an embodiment of the present disclosure.

Referring to FIGS. 1 to 6 and 7A, elements Vm,n corresponding to the 1st to 27th columns (n=1, . . . , 27) of the base matrix Hb in the 6th row (m=6) of the matrix C belonging to the base matrix Hb may be {164, 59, −1, 86, −1, −1, −1, −1, −1, −1, −1, 80, −1, −1, −1, 182, −1, −1, −1, −1, 130, 153, −1, −1, −1, −1}.

Elements Vm,n corresponding to the 1st to 27th columns (n=1, . . . , 27) of the base matrix Hb in the 7th row (m=7) of the matrix C belonging to the base matrix Hb may be {158, −1, −1, −1, −1, −1, 119, −1, −1, −1, 113, 21, −1, 63, −1, −1, −1, 51, 136, −1, 116, −1, −1, −1, −1, −1, −1}.

Elements Vm,n corresponding to the 1st to 27th columns (n=1, . . . , 27) of the base matrix Hb in the 8th row (m=8) of the matrix C belonging to the base matrix Hb may be {17, 76, −1, −1, 104, −1, −1, 100, 150, −1, −1, −1, −1, −1, 158, −1, −1, −1, −1, −1, −1, −1, −1, −1, −1, −1, −1}.

Elements Vm,n corresponding to the 1st to 27th columns (n=1, . . . , 27) of the base matrix Hb in the 9th row (m=9) of the matrix C belonging to the base matrix Hb may be {33, 95, −1, 4, −1, −1, −1, −1, −1, −1, −1, −1, 217, −1, −1, −1, 204, −1, −1, 39, −1, 58, 44, −1, 201, −1, −1}.

Elements Vm,n corresponding to the 1st to 27th columns (n=1, . . . , 27) of the base matrix Hb in the 10th row (m=10) of the matrix C belonging to the base matrix Hb may be {9, 37, −1, −1, −1, −1, −1, −1, −1, −1, 213, 105, −1, 89, −1, −1, −1, 185, 109, −1, 218, −1, −1, −1, −1, −1, −1}.

Elements Vm,n corresponding to the 1st to 27th columns (n=1, . . . , 27) of the base matrix Hb in the 11th row (m=11) of the matrix C belonging to the base matrix Hb may be {−1, 82, 165, −1, 174, −1, −1, 19, 194, −1, −1, −1, −1, −1, 103, −1, −1, −1, −1, −1, −1, −1, −1, −1, −1, −1, −1}.

Elements Vm,n corresponding to the 1st to 27th columns (n=1, . . . , 27) of the base matrix Hb in the 12th row (m=12) of the matrix C belonging to the base matrix Hb may be {52, 11, −1, −1, −1, −1, −1, −1, −1, −1, −1, 2, −1, −1, −1, 35, −1, −1, −1, −1, 32, 84, 201, −1, −1, −1}.

Elements Vm,n corresponding to the 1st to 27th columns (n=1, . . . , 27) of the base matrix Hb in the 13th row (m=13) of the matrix C belonging to the base matrix Hb may be {142, 175, −1, −1, −1, −1, −1, −1, −1, −1, 136, 3, −1, 28, −1, −1, −1, −1, 182, −1, −1, −1, −1, −1, −1, −1, −1}.

Elements Vm,n corresponding to the 1st to 27th columns (n=1, . . . , 27) of the base matrix Hb in the 14th row (m=14) of the matrix C belonging to the base matrix Hb may be {81, −1, −1, 56, −1, −1, −1, 72, −1, −1, −1, −1, −1, −1, −1, −1, −1, −1, −1, 217, −1, −1, 78, −1, −1, −1}.

Elements Vm,n corresponding to the 1st to 27th columns (n=1, . . . , 27) of the base matrix Hb in the 15th row (m=15) of the matrix C belonging to the base matrix Hb may be {14, −1, −1, −1, −1, −1, −1, −1, −1, −1, −1, 175, −1, −1, 211, 191, 51, −1, −1, −1, 43, −1, −1, −1, −1, −1}.

Elements Vm,n corresponding to the 1st to 27th columns (n=1, . . . , 27) of the base matrix Hb in the 16th row (m=16) of the matrix C belonging to the base matrix Hb may be {90, 120, −1, −1, −1, −1, −1, −1, −1, −1, 131, −1, −1, 209, −1, −1, −1, −1, 209, −1, −1, −1, −1, −1, 81, −1}.

Elements Vm,n corresponding to the 1st to 27th columns (n=1, . . . , 27) of the base matrix Hb in the 17th row (m=17) of the matrix C belonging to the base matrix Hb may be {−1, 154, −1, 164, −1, −1, −1, −1, −1, −1, −1, 43, −1, −1, −1, −1, −1, −1, −1, −1, 189, −1, 101, −1, −1, −1, −1}.

Elements Vm,n corresponding to the 1st to 27th columns (n=1, . . . , 27) of the base matrix Hb in the 18th row (m=18) of the matrix C belonging to the base matrix Hb may be {56, −1, −1, −1, −1, −1, −1, −1, −1, −1, −1, −1, −1, 110, −1, 200, 63, −1, −1, −1, 4, −1, −1, −1, −1, −1}.

Elements Vm,n corresponding to the 1st to 27th columns (n=1, . . . , 27) of the base matrix Hb in the 19th row (m=19) of the matrix C belonging to the base matrix Hb may be {−1, 199, −1, −1, −1, −1, −1, −1, −1, −1, 110, 200, −1, −1, −1, −1, 143, 186, −1, −1, −1, −1, −1, −1, −1}.

Elements Vm,n corresponding to the 1st to 27th columns (n=1, . . . , 27) of the base matrix Hb in the 20th row (m=20) of the matrix C belonging to the base matrix Hb may be {8, 6, −1, −1, −1, −1, −1, 103, 198, −1, 8, −1, −1, −1, −1, −1, −1, −1, −1, −1, −1, −1, −1, −1, −1, −1}.

Elements Vm,n corresponding to the 1st to 27th columns (n=1, . . . , 27) of the base matrix Hb in the 21st row (m=21) of the matrix C belonging to the base matrix Hb may be {105, −1, −1, 210, −1, −1, −1, −1, −1, 121, −1, 214, −1, −1, −1, −1, −1, −1, −1, −1, −1, −1, 183, −1, −1, −1, −1}.

Elements Vm,n corresponding to the 1st to 27th columns (n=1, . . . , 27) of the base matrix Hb in the 22nd row (m=22) of the matrix C belonging to the base matrix Hb may be {−1, 192, −1, −1, −1, 131, −1, −1, −1, −1, −1, −1, −1, −1, −1, 220, −1, −1, −1, 50, 106, −1, −1, −1, −1, −1}.

Elements Vm,n corresponding to the 1st to 27th columns (n=1, . . . , 27) of the base matrix Hb in the 23rd row (m=23) of the matrix C belonging to the base matrix Hb may be {53, −1, −1, −1, −1, −1, −1, −1, −1, −1, −1, 0, 3, −1, −1, −1, 148, −1, −1, −1, −1, −1, −1, −1, −1, −1}.

Elements Vm,n corresponding to the 1st to 27th columns (n=1, . . . , 27) of the base matrix Hb in the 24th row (m=24) of the matrix C belonging to the base matrix Hb may be {−1, 88, 203, −1, −1, −1, −1, −1, −1, 168, −1, −1, −1, −1, −1, −1, 122, −1, −1, −1, −1, −1, −1, −1, −1}.

Elements Vm,n corresponding to the 1st to 27th columns (n=1, . . . , 27) of the base matrix Hb in the 25th row (m=25) of the matrix C belonging to the base matrix Hb may be {49, −1, −1, 157, 64, −1, −1, −1, −1, −1, 193, −1, −1, −1, −1, −1, −1, −1, −1, −1, 124, −1, −1, −1, −1}.

For reference, the matrix C described with reference to FIG. 7A may be indicated as shown in Table 3.

TABLE 3

| 164 | 59  | −1  | 86  | −1  | −1  | −1  | −1  | −1  | −1  | −1  | −1  | 80  | −1  | −1  | −1  | 182 | −1  | −1  | −1  | −1  | 130 | 153 | −1  | −1  | −1  | −1  |
|-----|-----|-----|-----|-----|-----|-----|-----|-----|-----|-----|-----|-----|-----|-----|-----|-----|-----|-----|-----|-----|-----|-----|-----|-----|-----|-----|
| 158 | −1  | −1  | −1  | −1  | −1  | 119 | −1  | −1  | −1  | 113 | 21  | −1  | 63  | −1  | −1  | −1  | 51  | 136 | −1  | 116 | −1  | −1  | −1  | −1  | −1  | −1  |
| 17  | 76  | −1  | −1  | 104 | −1  | −1  | 100 | 150 | −1  | −1  | −1  | −1  | 158 | −1  | −1  | −1  | −1  | −1  | −1  | −1  | −1  | −1  | −1  | −1  | −1  | −1  |
| 33  | 95  | −1  | 4   | −1  | −1  | −1  | −1  | −1  | −1  | −1  | 217 | −1  | −1  | −1  | 204 | −1  | −1  | 39  | −1  | 58  | 44  | −1  | 201 | −1  | −1  | −1  |
| 9   | 37  | −1  | −1  | −1  | −1  | −1  | −1  | −1  | 213 | 105 | −1  | 89  | −1  | −1  | −1  | 185 | 109 | −1  | 218 | −1  | −1  | −1  | −1  | −1  | −1  | −1  |
| −1  | 82  | 165 | −1  | 174 | −1  | −1  | 19  | 194 | −1  | −1  | −1  | −1  | −1  | 103 | −1  | −1  | −1  | −1  | −1  | −1  | −1  | −1  | −1  | −1  | −1  | −1  |
| 52  | 11  | −1  | −1  | −1  | −1  | −1  | −1  | −1  | −1  | −1  | 2   | −1  | −1  | −1  | 35  | −1  | −1  | −1  | −1  | 32  | 84  | 201 | −1  | −1  | −1  | −1  |
| 142 | 175 | −1  | −1  | −1  | −1  | −1  | −1  | −1  | −1  | 136 | 3   | −1  | 28  | −1  | −1  | −1  | −1  | 182 | −1  | −1  | −1  | −1  | −1  | −1  | −1  | −1  |
| 81  | −1  | −1  | 56  | −1  | −1  | −1  | 72  | −1  | −1  | −1  | −1  | −1  | −1  | −1  | −1  | −1  | −1  | −1  | 217 | −1  | −1  | 78  | −1  | −1  | −1  | −1  |
| 14  | −1  | −1  | −1  | −1  | −1  | −1  | −1  | −1  | −1  | −1  | −1  | 175 | −1  | −1  | 211 | 191 | 51  | −1  | −1  | −1  | 43  | −1  | −1  | −1  | −1  | −1  |
| 90  | 120 | −1  | −1  | −1  | −1  | −1  | −1  | −1  | −1  | 13  | −1  | −1  | 209 | −1  | −1  | −1  | −1  | 209 | −1  | −1  | −1  | −1  | −1  | −1  | 81  | −1  |
| −1  | 154 | −1  | 164 | −1  | −1  | −1  | −1  | −1  | −1  | −1  | 43  | −1  | −1  | −1  | −1  | −1  | −1  | −1  | −1  | 189 | −1  | 101 | −1  | −1  | −1  | −1  |
| 56  | −1  | −1  | −1  | −1  | −1  | −1  | −1  | −1  | −1  | −1  | −1  | 110 | −1  | 200 | 63  | −1  | −1  | −1  | 4   | −1  | −1  | −1  | −1  | −1  | −1  | −1  |
| −1  | 199 | −1  | −1  | −1  | −1  | −1  | −1  | −1  | −1  | 110 | 200 | −1  | −1  | −1  | −1  | 143 | 186 | −1  | −1  | −1  | −1  | −1  | −1  | −1  | −1  | −1  |
| 8   | 6   | −1  | −1  | −1  | −1  | −1  | 103 | 198 | −1  | 8   | −1  | −1  | −1  | −1  | −1  | −1  | −1  | −1  | −1  | −1  | −1  | −1  | −1  | −1  | −1  | −1  |
| 105 | −1  | −1  | 210 | −1  | −1  | −1  | −1  | −1  | 121 | −1  | 214 | −1  | −1  | −1  | −1  | −1  | −1  | −1  | −1  | −1  | −1  | 183 | −1  | −1  | −1  | −1  |
| −1  | 192 | −1  | −1  | −1  | 131 | −1  | −1  | −1  | −1  | −1  | −1  | −1  | −1  | −1  | 220 | −1  | −1  | −1  | 50  | 106 | −1  | −1  | −1  | −1  | −1  | −1  |
| 53  | −1  | −1  | −1  | −1  | −1  | −1  | −1  | −1  | −1  | −1  | 0   | 3   | −1  | −1  | −1  | 148 | −1  | −1  | −1  | −1  | −1  | −1  | −1  | −1  | −1  | −1  |
| −1  | 88  | 203 | −1  | −1  | −1  | −1  | −1  | −1  | 168 | −1  | −1  | −1  | −1  | −1  | −1  | 122 | −1  | −1  | −1  | −1  | −1  | −1  | −1  | −1  | −1  | −1  |
| 49  | −1  | −1  | 157 | 64  | −1  | −1  | −1  | −1  | −1  | 193 | −1  | −1  | −1  | −1  | −1  | −1  | −1  | −1  | −1  | 124 | −1  | −1  | −1  | −1  | −1  | −1  |

Referring to FIGS. 1 to 6 and 7B, elements Vm,n corresponding to the 1st to 27th columns (n=1, . . . , 27) of the base matrix Hb in the 26th row (m=26) of the matrix C belonging to the base matrix Hb may be {−1, 1, −1, −1, −1, −1, 166, 65, −1, −1, −1, −1, −1, −1, 81, −1, −1, −1, −1, −1, −1, −1, −1, −1, −1, −1, −1}.

Elements Vm,n corresponding to the 1st to 27th columns (n=1, . . . , 27) of the base matrix Hb in the 27th row (m=27) of the matrix C belonging to the base matrix Hb may be {107, −1, 176, −1, 212, −1, −1, −1, −1, −1, −1, −1, −1, −1, −1, 127, −1, −1, −1, −1, −1, −1, −1, −1, −1, −1, −1}.

Elements Vm,n corresponding to the 1st to 27th columns (n=1, ..., 27) of the base matrix Hb in the 28th row (m=28) of the matrix C belonging to the base matrix Hb may be {−1, 208, −1, −1, −1, −1, 141, −1, 174, −1, −1, −1, −1, −1, −1, −1, −1, −1, −1, −1, −1, −1, −1, −1, −1, −1, −1}.

Elements Vm,n corresponding to the 1st to 27th columns (n=1, ..., 27) of the base matrix Hb in the 29th row (m=29) of the matrix C belonging to the base matrix Hb may be {146, −1, −1, −1, 153, −1, −1, −1, −1, −1, −1, −1, −1, −1, −1, −1, −1, −1, 217, −1, 114, −1, −1, −1, −1, −1}.

Elements Vm,n corresponding to the 1st to 27th columns (n=1, ..., 27) of the base matrix Hb in the 30th row (m=30) of the matrix C belonging to the base matrix Hb may be {−1, 150, −1, −1, −1, −1, −1, −1, −1, −1, −1, −1, −1, 11, −1, −1, −1, 53, −1, −1, −1, −1, −1, −1, 68, −1}.

Elements Vm,n corresponding to the 1st to 27th columns (n=1, ..., 27) of the base matrix Hb in the 31st row (m=31) of the matrix C belonging to the base matrix Hb may be {34, −1, −1, −1, −1, −1, −1, −1, −1, −1, 130, −1, −1, 210, −1, −1, −1, −1, −1, −1, −1, −1, −1, 123, −1, −1}.

Elements Vm,n corresponding to the 1st to 27th columns (n=1, ..., 27) of the base matrix Hb in the 32nd row (m=32) of the matrix C belonging to the base matrix Hb may be {−1, 175, −1, −1, −1, −1, −1, 49, −1, −1, −1, −1, −1, −1, −1, −1, −1, −1, −1, −1, −1, 177, −1, −1, 128, −1}.

Elements Vm,n corresponding to the 1st to 27th columns (n=1, ..., 27) of the base matrix Hb in the 33rd row (m=33) of the matrix C belonging to the base matrix Hb may be {192, −1, −1, −1, −1, −1, −1, −1, −1, −1, −1, −1, 209, −1, 58, −1, −1, −1, −1, −1, −1, −1, −1, 30, −1, −1}.

Elements Vm,n corresponding to the 1st to 27th columns (n=1, ..., 27) of the base matrix Hb in the 34th row (m=34) of the matrix C belonging to the base matrix Hb may be {−1, 114, 49, −1, −1, −1, −1, −1, −1, −1, −1, 161, −1, −1, −1, −1, −1, −1, −1, −1, −1, 137, −1, −1, −1, −1}.

Elements Vm,n corresponding to the 1st to 27th columns (n=1, ..., 27) of the base matrix Hb in the 35th row (m=35) of the matrix C belonging to the base matrix Hb may be {82, −1, −1, −1, −1, −1, −1, 186, −1, −1, −1, −1, −1, −1, 68, −1, 150, −1, −1, −1, −1, −1, −1, −1, −1, −1}.

Elements Vm,n corresponding to the 1st to 27th columns (n=1, ..., 27) of the base matrix Hb in the 36th row (m=36) of the matrix C belonging to the base matrix Hb may be {−1, 192, −1, −1, −1, −1, 173, −1, −1, −1, −1, −1, 26, −1, −1, −1, −1, −1, −1, −1, −1, 187, −1, −1, −1, −1}.

Elements Vm,n corresponding to the 1st to 27th columns (n=1, ..., 27) of the base matrix Hb in the 37th row (m=37) of the matrix C belonging to the base matrix Hb may be {222, −1, −1, −1, −1, −1, −1, −1, −1, −1, −1, −1, −1, −1, 157, 0, −1, −1, 6, −1, −1, −1, −1, −1, −1, −1}.

Elements Vm,n corresponding to the 1st to 27th columns (n=1, ..., 27) of the base matrix Hb in the 38th row (m=38) of the matrix C belonging to the base matrix Hb may be {−1, 81, −1, −1, −1, −1, −1, −1, −1, −1, −1, −1, −1, 195, −1, −1, −1, −1, −1, −1, −1, −1, 138, −1, −1, −1}.

Elements Vm,n corresponding to the 1st to 27th columns (n=1, ..., 27) of the base matrix Hb in the 39th row (m=39) of the matrix C belonging to the base matrix Hb may be {123, −1, −1, −1, −1, −1, −1, −1, −1, 90, 73, −1, 10, −1, −1, −1, −1, −1, −1, −1, −1, −1, −1, −1, −1, −1}.

Elements Vm,n corresponding to the 1st to 27th columns (n=1, ..., 27) of the base matrix Hb in the 40th row (m=40) of the matrix C belonging to the base matrix Hb may be {−1, 12, −1, 77, −1, −1, −1, 49, −1, −1, −1, −1, −1, −1, −1, −1, −1, −1, 114, −1, −1, −1, −1, −1, −1, −1}.

Elements Vm,n corresponding to the 1st to 27th columns (n=1, ..., 27) of the base matrix Hb in the 41st row (m=41) of the matrix C belonging to the base matrix Hb may be {67, −1, −1, −1, −1, −1, −1, 45, −1, −1, −1, −1, −1, −1, −1, −1, 96, −1, −1, −1, −1, −1, −1, −1, −1, −1}.

Elements Vm,n corresponding to the 1st to 27th columns (n=1, ..., 27) of the base matrix Hb in the 42nd row (m=42) of the matrix C belonging to the base matrix Hb may be {−1, 23, −1, 215, −1, −1, −1, −1, −1, 60, −1, −1, −1, −1, −1, −1, −1, −1, 167, −1, −1, −1, −1, −1, −1, −1}.

Elements Vm,n corresponding to the 1st to 27th columns (n=1, ..., 27) of the base matrix Hb in the 43rd row (m=43) of the matrix C belonging to the base matrix Hb may be {114, −1, −1, −1, 91, −1, −1, −1, −1, −1, −1, −1, −1, −1, −1, −1, −1, −1, −1, −1, −1, −1, 78, −1, −1}.

Elements Vm,n corresponding to the 1st to 27th columns (n=1, ..., 27) of the base matrix Hb in the 44th row (m=44) of the matrix C belonging to the base matrix Hb may be {−1, 206, −1 −1, −1, −1, −1, −1, −1, −1, −1, −1, −1, −1, −1, 22, −1, 134, −1, −1, −1, −1, −1, −1, 161, −1}.

Elements Vm,n corresponding to the 1st to 27th columns (n=1, ..., 27) of the base matrix Hb in the 45th row (m=45) of the matrix C belonging to the base matrix Hb may be {84, −1, −1, −1, −1, −1, −1, 4, −1, 9, −1, −1, −1, −1, −1, −1, −1, −1, −1, −1, 12, −1, −1, −1, −1}.

Elements Vm,n corresponding to the 1st to 27th columns (n=1, ..., 27) of the base matrix Hb in the 46th row (m=46) of the matrix C belonging to the base matrix Hb may be {−1, 184, −1, −1, −1, −1, 121, −1, −1, −1, 29, −1, −1, −1, −1, −1, −1, −1, −1, −1, −1, −1, −1, −1, −1}.

For reference, the matrix C described with reference to FIG. 7B may be indicated as shown in Table 4.

TABLE 4

| −1 | 1 | −1 | −1 | −1 | −1 | 166 | 65 | −1 | −1 | −1 | −1 | −1 | −1 | 81 | −1 | −1 | −1 | −1 | −1 | −1 | −1 | −1 | −1 | −1 | −1 |
|---|---|---|---|---|---|---|---|---|---|---|---|---|---|---|---|---|---|---|---|---|---|---|---|---|---|
| 107 | −1 | 176 | −1 | 212 | −1 | −1 | −1 | −1 | −1 | −1 | −1 | −1 | −1 | 127 | −1 | −1 | −1 | −1 | −1 | −1 | −1 | −1 | −1 | −1 | −1 |
| −1 | 208 | −1 | −1 | −1 | −1 | 14 | −1 | 174 | −1 | −1 | −1 | −1 | −1 | −1 | −1 | −1 | −1 | −1 | −1 | −1 | −1 | −1 | −1 | −1 | −1 |
| 146 | −1 | −1 | −1 | 153 | −1 | −1 | −1 | −1 | −1 | −1 | −1 | −1 | −1 | −1 | −1 | −1 | 217 | −1 | 114 | −1 | −1 | −1 | −1 | −1 | −1 |
| −1 | 150 | −1 | −1 | −1 | −1 | −1 | −1 | −1 | −1 | −1 | −1 | −1 | 11 | −1 | −1 | −1 | 53 | −1 | −1 | −1 | −1 | − | −1 | 68 | −1 |
| 34 | −1 | −1 | −1 | −1 | −1 | −1 | −1 | −1 | 130 | −1 | −1 | 210 | −1 | −1 | −1 | −1 | −1 | −1 | −1 | −1 | −1 | −1 | 123 | −1 | −1 |
| −1 | 175 | −1 | −1 | −1 | −1 | −1 | 49 | −1 | −1 | −1 | −1 | −1 | −1 | −1 | −1 | −1 | −1 | −1 | 177 | −1 | −1 | 128 | −1 |
| 192 | −1 | −1 | −1 | −1 | −1 | −1 | −1 | −1 | −1 | −1 | −1 | 209 | −1 | 58 | −1 | −1 | −1 | −1 | −1 | −1 | −1 | −1 | 30 | −1 | −1 |
| −1 | 114 | 49 | −1 | −1 | −1 | −1 | −1 | −1 | −1 | −1 | 161 | −1 | −1 | −1 | −1 | −1 | −1 | −1 | −1 | −1 | 137 | −1 | −1 | −1 | −1 |
| 82 | −1 | −1 | −1 | −1 | −1 | 186 | −1 | −1 | −1 | −1 | −1 | −1 | −1 | 68 | −1 | 150 | −1 | −1 | −1 | −1 | −1 | −1 | −1 | −1 | −1 |
| −1 | 192 | −1 | −1 | −1 | −1 | 173 | −1 | −1 | −1 | −1 | −1 | 26 | −1 | −1 | −1 | −1 | −1 | −1 | −1 | −1 | 187 | −1 | −1 | −1 | −1 |
| 222 | −1 | −1 | −1 | −1 | −1 | −1 | −1 | −1 | −1 | −1 | −1 | −1 | −1 | 157 | 0 | −1 | −1 | 6 | −1 | −1 | −1 | −1 | −1 | −1 | −1 |
| −1 | 81 | −1 | −1 | −1 | −1 | −1 | −1 | −1 | −1 | −1 | −1 | −1 | 195 | −1 | −1 | −1 | −1 | −1 | −1 | −1 | −1 | 138 | −1 | −1 | −1 |
| 123 | −1 | −1 | −1 | −1 | −1 | −1 | 90 | 73 | −1 | 10 | −1 | −1 | −1 | −1 | −1 | −1 | −1 | −1 | −1 | −1 | −1 | −1 | −1 | −1 | −1 |
| −1 | 12 | −1 | 77 | −1 | −1 | −1 | 49 | −1 | −1 | −1 | −1 | −1 | −1 | −1 | −1 | −1 | −1 | 114 | −1 | −1 | −1 | −1 | −1 | −1 | −1 |
| 67 | −1 | −1 | −1 | −1 | −1 | −1 | 45 | −1 | −1 | −1 | −1 | −1 | −1 | −1 | −1 | 96 | −1 | −1 | −1 | −1 | −1 | −1 | −1 | −1 | −1 |
| −1 | 23 | −1 | 215 | −1 | −1 | −1 | −1 | −1 | 60 | −1 | −1 | −1 | −1 | −1 | −1 | −1 | −1 | 167 | −1 | −1 | −1 | −1 | −1 | −1 | −1 |

TABLE 4-continued

| 114 | -1 | -1 | -1 | 91 | -1 | -1 | -1 | -1 | -1 | -1 | -1 | -1 | -1 | -1 | -1 | -1 | -1 | -1 | -1 | -1 | -1 | -1 | 78 | -1 | -1 |
| -1 | 206 | -1 | -1 | -1 | -1 | -1 | -1 | -1 | -1 | -1 | -1 | -1 | -1 | 22 | -1 | 134 | -1 | -1 | -1 | -1 | -1 | -1 | 161 | -1 |
| 84 | -1 | -1 | -1 | -1 | -1 | -1 | 4 | -1 | 9 | -1 | -1 | -1 | -1 | -1 | -1 | -1 | -1 | -1 | -1 | 12 | -1 | -1 | -1 | -1 |
| -1 | 184 | -1 | -1 | -1 | -1 | 121 | -1 | -1 | -1 | 29 | -1 | -1 | -1 | -1 | -1 | -1 | -1 | -1 | -1 | -1 | -1 | -1 | -1 | -1 |

Figure 8A:
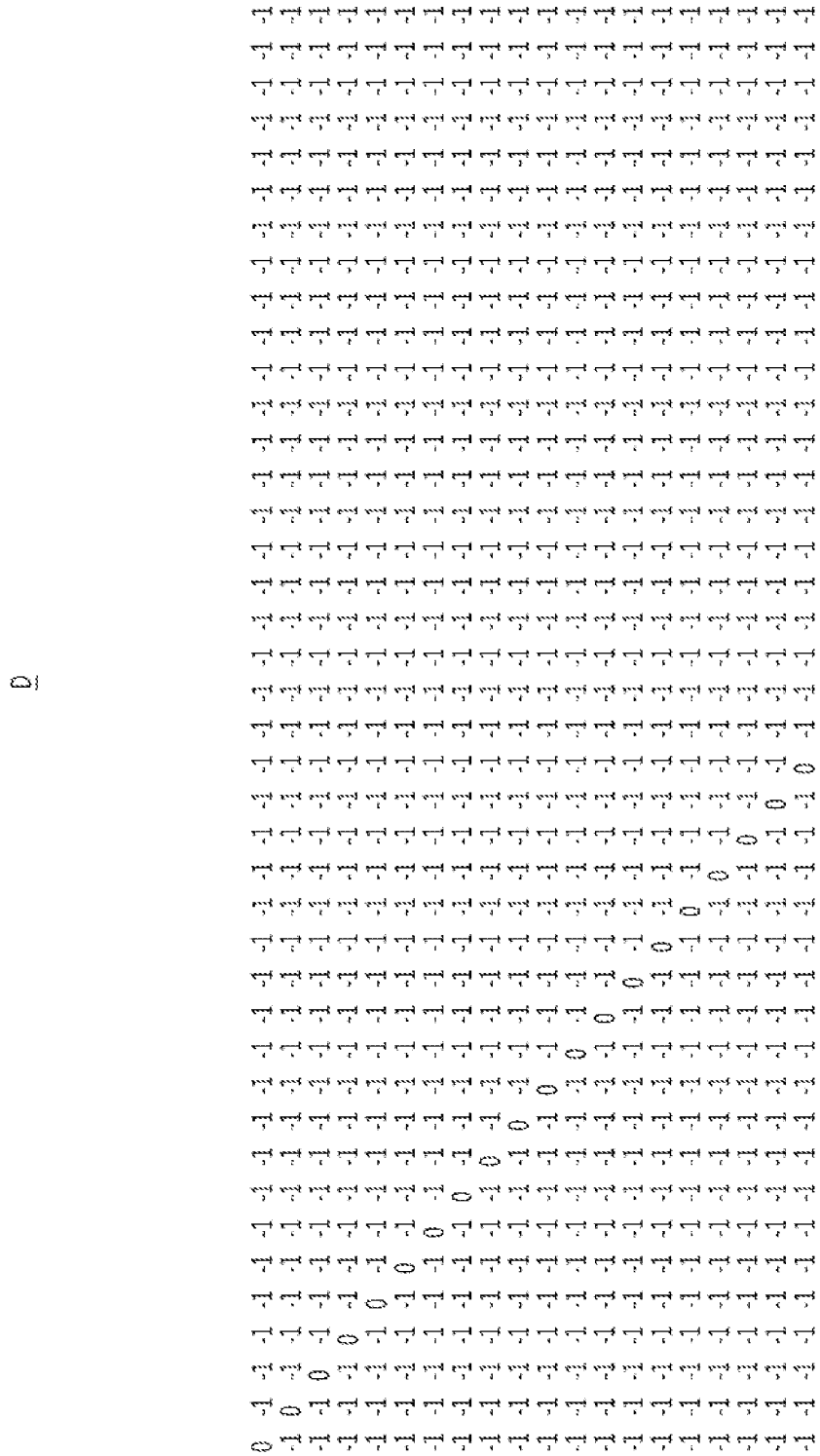

FIGS. 8A and 8B illustrate a matrix D belonging to a base matrix according to an embodiment of the present disclosure.

Referring to FIGS. 1 to 8A, the matrix D belonging to the base matrix Hb may include a plurality of elements corresponding to the 28th to 68th columns (n=28, . . . , 68) of the base matrix Hb in the 6th to 25th rows (m=6, . . . , 25) of the base matrix Hb.

Referring to FIGS. 1 to 7 and 8B, the matrix D belonging to the base matrix Hb may include a plurality of elements corresponding to the 28th to 68th columns (n=28, . . . , 68) of the base matrix Hb in the 26th to 46th rows (m=26, . . . , 46) of the base matrix Hb.

20 diagonal elements illustrated in FIG. 8A may be understood as elements corresponding to locations defined by rows (m=6, . . . , 25) and columns (n=28, . . . , 47) satisfying Equation 7 indicated below. Similarly, 21 diagonal elements illustrated in FIG. 8B may be understood as elements corresponding to locations defined by rows (m=26, . . . , 46) and columns (n=48, . . . , 68) satisfying Equation 7 indicated below.

$$m+22=n \quad \text{Equation 7}$$

Figure 9:
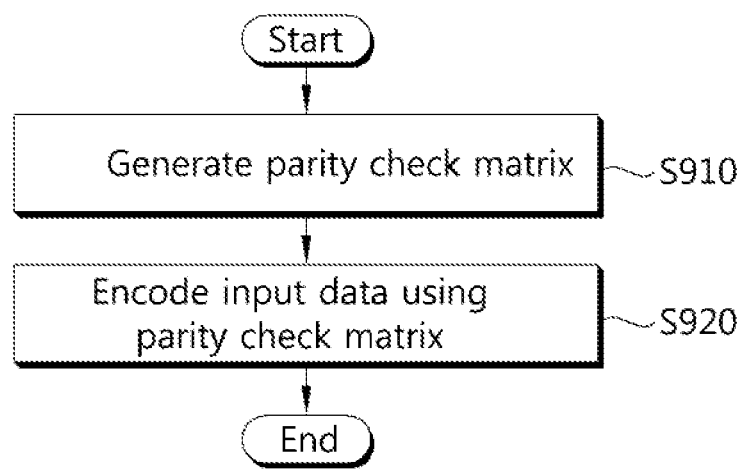
FIG. 9 is a flowchart illustrating a method of performing encoding based on a parity check matrix of an LDPC code according to an embodiment of the present disclosure.

FIG. 9 is a flowchart illustrating a method of performing encoding based on a parity check matrix of an LDPC code according to an embodiment of the present disclosure.

Referring to FIGS. 1 to 9, a UE according to this embodiment may generate the parity check matrix of the LDPC code in step S910.

The parity check matrix according to this embodiment may correspond to a characteristic matrix. The characteristic matrix may include 22 information columns for input data.

Each element of the characteristic matrix may correspond to a shift index value determined through a modulo operation between an element of a location corresponding to the element of the characteristic matrix in the base matrix and a lifting value. In addition, the base matrix may be a 46×68 matrix. As described above, the base matrix may be defined as a form as shown in FIG. 5.

In this disclosure, the lifting value may be associated with the length of input data. In this disclosure, the lifting value may be determined as one of 7, 14, 28, 56, 112, and 224.

For example, the input data may be any one of a plurality of input data obtained by splitting initial data of a TBS exceeding a preset threshold size (e.g., 8448 bits) according to the above length K.

The matrix A (i.e., A of FIG. 5) belonging to the base matrix Hb of this disclosure may include a plurality of elements corresponding to the 1st to 27th columns of the base matrix in the 1st to 5th rows of the base matrix. In this case, the plural elements of the matrix A (i.e., A of FIG. 5) may correspond to the elements shown in FIG. 6.

The matrix B (i.e., B of FIG. 5) belonging to the base matrix Hb of this disclosure may include a plurality of elements corresponding to the 28th to 68th columns of the base matrix in the 1st to 5th rows of the base matrix.

Specifically, all of the elements corresponding to the 28th to 68th columns of the base matrix in the 1st row of the base matrix Hb may be '−1'. All of the elements corresponding to the 28th to 68th columns of the base matrix in the 2nd row of the base matrix may be '−1'. All of the elements corresponding to the 28th to 68th columns of the base matrix in the 3rd row of the base matrix may be '−1'. All of the elements corresponding to the 28th to 68th columns of the base matrix in the 5th row of the base matrix may be '−1'.

The matrix C (i.e., C of FIG. 5) belonging to the base matrix Hb of this disclosure may include a plurality of elements corresponding to the 1st to 27th columns of the base matrix in the 6th to 46th rows of the base matrix. The plural elements of the matrix C (i.e., C of FIG. 5) may correspond to the elements described in FIGS. 7A and 7B.

In the matrix D (i.e., D of FIG. 5) belonging to the base matrix Hb of this disclosure, plural elements corresponding to the 28th to 68th columns of the base matrix in the 6th to 46th rows of the base matrix may correspond to all elements of a 41×41 identity matrix.

Notably, the aforementioned modulo operation may be performed when an element corresponding to the characteristic matrix in the base matrix is an integer equal to or greater than 0.

When a corresponding element in the base matrix is −1, the modulo operation is not performed and −1 may be determined as an element of the characteristic matrix. In this disclosure, when a corresponding element in the base matrix Hb is '−1', the element may correspond to a zero matrix.

For example, when a shift index value is '0' or a natural number equal to or greater than '1', each element of the characteristic matrix may correspond to a Zc×Zc identity matrix. All elements of the identity matrix may be shifted to the right according to the shift index value.

In step S820, the UE according to the present embodiment may encode the input data using the parity check matrix.

If the present embodiment described with reference to FIGS. 1 to 8 is applied, when the shift index value of the characteristic matrix of FIG. 4 is changed according to the length of information bits based on a single base matrix of FIG. 5, the parity check matrix (e.g., FIG. 3) of an LDPC code having high reliability can be obtained.

For reference, if a shift index value (e.g., a plurality of elements of a characteristic matrix) optimized for a specific information bit length and a specific code rate is used, performance may be degraded in other information bit lengths and other code rates.

It may be assumed that an optimal cycle distribution for a first information bit length and a first code rate is p1 and an optimal cycle distribution for a second information bit length and a second code rate is p2. If optimization for the first information bit length and the first code rate is first performed, it is necessary to search for a sub-optimal distribution p1' capable of obtaining a sub-optimal distribution p2' rather than searching for the optimal cycle distribution p1 in consideration of the second information bit length and the second code rate.

However, in an actual communication system, since there are numerous combinations of information bit lengths and code rates, it is very difficult to simultaneously search for shift index values of all submatrices P in consideration of the number of all cases.

In addition, shortening may be used to apply an information bit length required by a communication system to an actual LDPC code. For example, if the length Kb for information columns is 22 and the lifting value Zc is 20, the information bit length to be encoded may be 440.

In this case, to support the information bit length of 432 in the communication system, 8 information bits may be padded with 0 and shortening may be applied to a parity check matrix H. Therefore, it is necessary to design the system so as to optimize performance degradation even without actually applying shortening.

If shortening is applied, some columns of the parity check matrix H may not be used for decoding or even when some columns of the parity check matrix H are used for decoding, this does not substantially affect performance.

If the parity check matrix H designed without considering shortening is shortened, a cycle of a short length may disappear because some columns disappear due to shortening. In this case, shortening may improve performance of the communication system. In contrast, a cycle of a long length may disappear due to shortening. In this case, shortening may adversely affect performance of the communication system.

That is, if the parity check matrix H is designed without considering shortening, it is necessary to assume the case in which a desirable cycle disappears due to shortening. That is, it is necessary to select many cycles of a long length so as to maintain performance even though a part of desirable cycles disappears due to shortening.

Generally, as a slope of a block error rate (BLER) performance curve becomes sharper, it may be assumed that there are many cycles having a long length. Therefore, the slope of the BLER performance curve may be considered to be a significant element in designing the parity check matrix H.

The above-described parity check matrix H of this disclosure may be generated as follows.

1. Configure a target BLER.
2. Generate n parity check matrices H with respect to a first information bit length and a first code rate.
3. Calculate a signal-to-noise ratio (SNR) capable of achieving the target BLER with respect to the n parity check matrices H.
4. Group the n parity check matrices H into a plurality of groups according to an SNR value.

As a first method of classifying the n parity check matrices H, a reference SNR may be selected. Parity check matrices H in which the ratio of the reference SNR to the SNR is equal to or greater than x1 may be configured as group 1. Parity check matrices H in which the ratio of the reference SNR to the SNR is less than x1 and equal to or greater than x2 may be configured as group 2. This process is repeated. Herein, the reference SNR may be a preselected value. Alternatively, an 1-th SNR (where 1 is an integer greater than 1) to the last in size among the n parity check matrices H may be selected as the reference SNR.

As a second method for classifying the n parity check matrices H, SNR values of the n parity check matrices H are arranged in order from a small SNR value to a large SNR value. m1 parity check matrices H having the largest SNR values may be configured as group 1. m2 parity check matrices H having the next largest SNR values may be configured as group 2. This process is repeated. The second method may have a high possibility of selecting a larger slope value of the BLER curve than the first method.

As a third method for classifying the n parity check matrices H, both the first method and the second method may be used. For example, the first method may be applied to the first information bit length and the second method may be applied to the second information bit length. Generally, since information bits of a short length may cause a high possibility of affecting shortening, the second method may be applied. Since information bits of a relatively long length may cause a low possibility of affecting shortening, the second method may be applied.

5. Select a parity check matrix H having the largest slope of the BLER curve from the first group classified according to the SNR. If the first group is not present, the parity check matrix H having the largest slope of the BLER curve may be selected from the second group. If the second group is not present, the parity check matrix H having the largest slope of the BLER curve may be selected from the third group.

6. Generate n' parity check matrices H of the second information bit length and the second code rate using the parity check matrices H of the first information bit length and the first code and repeat the processes of 2 to 5.

Although the invention has been described with reference to exemplary embodiments, those skilled in the art will appreciate that various modifications and variations can be made in the present invention without departing from the spirit and scope of the invention as described in the appended claims. Thus, it is intended that the present invention cover the modifications and variations of this invention provided they come within the scope of the appended claims and their equivalents.

The invention claimed is:

1. A method of encoding information, by a transmitting device using a parity check matrix of a low-density parity-check code, for transmission over a communication channel, the method comprising:

determining, by the transmitting device, the parity check matrix comprising a plurality of submatrices that each have dimension Z×Z for a non-negative integer Z, wherein among the plurality of submatrices:

for m=0, the submatrix arranged in rows mZ to (m+1)Z−1 and in columns nZ to (n+1)Z−1 for each value of n=0, 1, 2, 3, 5, 6, 9, 10, 11, 12, 13, 15, 16, 18, 19, 20, 21, 22, 23 is obtained based on a respective value according to:

| n | value |
|---|---|
| 0 | 223 |
| 1 | 16 |
| 2 | 94 |
| 3 | 91 |
| 5 | 74 |
| 6 | 10 |
| 9 | 0 |
| 10 | 205 |
| 11 | 216 |
| 12 | 21 |
| 13 | 215 |
| 15 | 14 |
| 16 | 70 |
| 18 | 141 |
| 19 | 198 |
| 20 | 104 |
| 21 | 81 |
| 22 | 1 |
| 23 | 0 | for m=1, the submatrix arranged in rows mZ to (m+1)Z−1 and in columns nZ to (n+1)Z−1 for each value of n=0, 2, 3, 4, 5, 7, 8, 9, 11, 12, 14, 15, 16, 17, 19, 21, 22, 23, 24 is obtained based on a respective value according to:

| n | value |
|---|---|
| 0 | 141 |
| 2 | 45 |
| 3 | 151 |
| 4 | 46 |
| 5 | 119 |
| 7 | 157 |
| 8 | 133 |
| 9 | 87 |
| 11 | 206 |
| 12 | 93 |
| 14 | 79 |
| 15 | 9 |
| 16 | 118 |
| 17 | 194 |
| 19 | 31 |
| 21 | 187 |
| 22 | 0 |
| 23 | 0 |
| 24 | 0 | for m=2, the submatrix arranged in rows mZ to (m+1)Z−1 and in columns nZ to (n+1)Z−1 for each value of n={0, 1, 2, 4, 5, 6, 7, 8, 9, 10, 13, 14, 15, 17, 18, 19, 20, 24, 25} is obtained based on a respective value according to:

| n | value |
|---|---|
| 0 | 207 |
| 1 | 203 |
| 2 | 31 |
| 4 | 176 |
| 5 | 180 |
| 6 | 186 |
| 7 | 95 |
| 8 | 153 |
| 9 | 177 |
| 10 | 70 |
| 13 | 77 |
| 14 | 214 |
| 15 | 77 |
| 17 | 198 |
| 18 | 117 |
| 19 | 223 |
| 20 | 90 |
| 24 | 0 |
| 25 | 0 | for m=3, the submatrix arranged in rows mZ to (m+1)Z−1 and in columns nZ to (n+1)Z−1 for each value of n=0, 1, 3, 4, 6, 7, 8, 10, 11, 12, 13, 14, 16, 17, 18, 20, 21, 22, 25 is obtained based on a respective value according to:

| n | value |
|---|---|
| 0 | 201 |
| 1 | 18 |
| 3 | 165 |
| 4 | 5 |
| 6 | 45 |
| 7 | 142 |
| 8 | 16 |
| 10 | 34 |
| 11 | 155 |
| 12 | 213 |
| 13 | 147 |
| 14 | 69 |
| 16 | 96 |
| 17 | 74 |
| 18 | 99 |
| 20 | 30 |
| 21 | 158 |
| 22 | 1 |
| 25 | 0 | for m=4, the submatrix arranged in rows mZ to (m+1)Z−1 and in columns nZ to (n+1)Z−1 for each value of n=0, 1, 26 is obtained based on a respective value according to:

| n | value |
|---|---|
| 0 | 170 |
| 1 | 10 |
| 26 | 0 | generating encoded data, by the transmitting device, based on encoding the information with the determined parity check matrix; and transmitting, by a transceiver of the transmitting device, the encoded data over the communication channel.

2. The method according to claim 1, wherein for each value of m=0, . . . , 4, the submatrix arranged in rows mZ to (m+1)Z−1 and in columns nZ to (n+1)Z−1 of the parity check matrix is obtained further based on a value of the non-negative integer Z.

3. The method according to claim 1, wherein for m=0, the submatrix arranged in rows mZ to (m+1)Z−1 and in columns nZ to (n+1)Z−1 for each value of n other than 0, 1, 2, 3, 5, 6, 9, 10, 11, 12, 13, 15, 16, 18, 19, 20, 21, 22, 23 is equal to an all-zero matrix of size Z×Z, for m=1, the submatrix arranged in rows mZ to (m+1)Z−1 and in columns nZ to (n+1)Z−1 for each value of n other than 0, 2, 3, 4, 5, 7, 8, 9, 11, 12, 14, 15, 16, 17, 19, 21, 22, 23, 24 is equal to an all-zero matrix of size Z×Z, for m=2, the submatrix arranged in rows mZ to (m+1)Z−1 and in columns nZ to (n+1)Z−1 for each value of n other than 0, 1, 2, 4, 5, 6, 7, 8, 9, 10, 13, 14, 15, 17, 18, 19, 20, 24, 25 is equal to an all-zero matrix of size Z×Z, for m=3, the submatrix arranged in rows mZ to (m+1)Z−1 and in columns nZ to (n+1)Z−1 for each value of n other than 0, 1, 3, 4, 6, 7, 8, 10, 11, 12, 13, 14, 16, 17, 18, 20, 21, 22, 25 is equal to an all-zero matrix of size Z×Z, and for m=4, the submatrix arranged in rows mZ to (m+1)Z−1 and in columns nZ to (n+1)Z−1 for each value of n other than 0, 1, 26 is equal to an all-zero matrix of size Z×Z.

4. The method according to claim 1, wherein the parity check matrix has 46Z rows, and wherein:

for m=5, the submatrix arranged in rows mZ to (m+1)Z−1 and in columns nZ to (n+1)Z−1 for each value of n=0, 1, 3, 12, 16, 21, 22 is obtained based on a respective value according to:

| n | value |
|---|---|
| 0 | 164 |
| 1 | 59 |
| 3 | 86 |
| 12 | 80 |
| 16 | 182 |
| 21 | 130 |
| 22 | 153 | for m=6, the submatrix arranged in rows mZ to (m+1)Z−1 and in columns nZ to (n+1)Z−1 for each value of n=0, 6, 10, 11, 13, 17, 18, 20 is obtained based on a respective value according to:

| n | value |
|---|---|
| 0 | 158 |
| 6 | 119 |
| 10 | 113 |
| 11 | 21 |
| 13 | 63 |
| 17 | 51 |
| 18 | 136 |
| 20 | 116 | for m=7, the submatrix arranged in rows mZ to (m+1)Z−1 and in columns nZ to (n+1)Z−1 for each value of n=0,1, 4, 7, 8,14 is obtained based on a respective value according to:

| n | value |
|---|---|
| 0 | 17 |
| 1 | 76 |
| 4 | 104 |
| 7 | 100 |
| 8 | 150 |
| 14 | 158 | for m=8, the submatrix arranged in rows mZ to (m+1)Z−1 and in columns nZ to (n+1)Z−1 for each value of n=0, 1, 3, 12, 16, 19, 21, 22, 24 is obtained based on a respective value according to:

| n | value |
|---|---|
| 0 | 33 |
| 1 | 95 |
| 3 | 4 |
| 12 | 217 |
| 16 | 204 |
| 19 | 39 |
| 21 | 58 |
| 22 | 44 |
| 24 | 201 | for m=9, the submatrix arranged in rows mZ to (m+1)Z−1 and in columns nZ to (n+1)Z−1 for each value of n=0, 1, 10, 11, 13, 17, 18, 20 is obtained based on a respective value according to:

| n | value |
|---|---|
| 0 | 9 |
| 1 | 37 |
| 10 | 213 |
| 11 | 105 |
| 13 | 89 |
| 17 | 185 |
| 18 | 109 |
| 20 | 218 | for m=10, the submatrix arranged in rows mZ to (m+1)Z−1 and in columns nZ to (n+1)Z−1 for each value of n=1, 2, 4, 7, 8, 14 is obtained based on a respective value according to:

| n | value |
|---|---|
| 1 | 82 |
| 2 | 165 |
| 4 | 174 |
| 7 | 19 |
| 8 | 194 |
| 14 | 103 | for m=11, the submatrix arranged in rows mZ to (m+1)Z−1 and in columns nZ to (n+1)Z−1 for each value of n=0, 1, 12, 16, 21, 22, 23 is obtained based on a respective value according to:

| n | value |
|---|---|
| 0 | 52 |
| 1 | 11 |
| 12 | 2 |
| 16 | 35 |
| 21 | 32 |
| 22 | 84 |
| 23 | 201 | for m=12, the submatrix arranged in rows mZ to (m+1)Z−1 and in columns nZ to (n+1)Z−1 for each value of n=0, 1, 10, 11, 13, 18 is obtained based on a respective value according to:

| n | value |
|---|---|
| 0 | 142 |
| 1 | 175 |
| 10 | 136 |
| 11 | 3 |
| 13 | 28 |
| 18 | 182 | for m=13, the submatrix arranged in rows mZ to (m+1)Z−1 and in columns nZ to (n+1)Z−1 for each value of n=0, 3, 7, 20, 23 is obtained based on a respective value according to:

| n | value |
|---|---|
| 0 | 81 |
| 3 | 56 |
| 7 | 72 |
| 20 | 217 |
| 23 | 78 | for m=14, the submatrix arranged in rows mZ to (m+1)Z−1 and in columns nZ to (n+1)Z−1 for each value of n=0, 12, 15, 16, 17, 21 is obtained based on a respective value according to:

| n | value |
|---|---|
| 0 | 14 |
| 12 | 175 |
| 15 | 211 |
| 16 | 191 |
| 17 | 51 |
| 21 | 43 | for m=15, the submatrix arranged in rows mZ to (m+1)Z−1 and in columns nZ to (n+1)Z−1 for each value of n=0, 1, 10, 13, 18, 25 is obtained based on a respective value according to:

| n | value |
|---|---|
| 0 | 90 |
| 1 | 120 |
| 10 | 131 |
| 13 | 209 |
| 18 | 209 |
| 25 | 81 | for m=16, the submatrix arranged in rows mZ to (m+1)Z−1 and in columns nZ to (n+1)Z−1 for each value of n=1, 3, 11, 20, 22 is obtained based on a respective value according to:

| n | value |
|---|---|
| 1 | 154 |
| 3 | 164 |
| 11 | 43 |
| 20 | 189 |
| 22 | 101 | for m=17, the submatrix arranged in rows mZ to (m+1)Z−1 and in columns nZ to (n+1)Z−1 for each value of n=0, 14, 16, 17, 21 is obtained based on a respective value according to:

| n | value |
|---|---|
| 0 | 56 |
| 14 | 110 |
| 16 | 200 |
| 17 | 63 |
| 21 | 4 | for m=18, the submatrix arranged in rows mZ to (m+1)Z−1 and in columns nZ to (n+1)Z−1 for each value of n=1, 12, 13, 18, 19 is obtained based on a respective value according to:

| n | value |
|---|---|
| 1 | 199 |
| 12 | 110 |
| 13 | 200 |
| 18 | 143 |
| 19 | 186 | for m=19, the submatrix arranged in rows mZ to (m+1)Z−1 and in columns nZ to (n+1)Z−1 for each value of n=0, 1, 7, 8, 10 is obtained based on a respective value according to:

| n | value |
|---|---|
| 0 | 8 |
| 1 | 6 |
| 7 | 103 |
| 8 | 198 |
| 10 | 8 | for m=20, the submatrix arranged in rows mZ to (m+1)Z−1 and in columns nZ to (n+1)Z−1 for each value of n=0, 3, 9, 11, 22 is obtained based on a respective value according to:

| n | value |
|---|---|
| 0 | 105 |
| 3 | 210 |
| 9 | 121 |
| 11 | 214 |
| 22 | 183 | for m=21, the submatrix arranged in rows mZ to (m+1)Z−1 and in columns nZ to (n+1)Z−1 for each value of n=1, 5, 16, 20, 21 is obtained based on a respective value according to:

| n | value |
|---|---|
| 1 | 192 |
| 5 | 131 |
| 16 | 220 |
| 20 | 50 |
| 21 | 106 | for m=22, the submatrix arranged in rows mZ to (m+1)Z−1 and in columns nZ to (n+1)Z−1 for each value of n=0, 12, 13, 17 is obtained based on a respective value according to:

| n | value |
|---|---|
| 0 | 53 |
| 12 | 0 |
| 13 | 3 |
| 17 | 148 | for m=23, the submatrix arranged in rows mZ to (m+1)Z−1 and in columns nZ to (n+1)Z−1 for each value of n=1, 2, 10, 18 is obtained based on a respective value according to:

| n | value |
|---|---|
| 1 | 88 |
| 2 | 203 |
| 10 | 168 |
| 18 | 122 | for m=24, the submatrix arranged in rows mZ to (m+1)Z−1 and in columns nZ to (n+1)Z−1 for each value of n=0, 3, 4, 11, 22 is obtained based on a respective value according to:

| n | value |
|---|---|
| 0 | 49 |
| 3 | 157 |
| 4 | 64 |
| 11 | 193 |
| 22 | 124 | for m=25, the submatrix arranged in rows mZ to (m+1)Z−1 and in columns nZ to (n+1)Z−1 for each value of n=1, 6, 7, 14 is obtained based on a respective value according to:

| n | value |
|---|---|
| 1 | 1 |
| 6 | 166 |
| 7 | 65 |
| 14 | 81 | for m=26, the submatrix arranged in rows mZ to (m+1)Z−1 and in columns nZ to (n+1)Z−1 for each value of n=0, 2, 4,15 is obtained based on a respective value according to:

| n | value |
|---|---|
| 0 | 107 |
| 2 | 176 |
| 4 | 212 |
| 15 | 127 | for m=27, the submatrix arranged in rows mZ to (m+1)Z−1 and in columns nZ to (n+1)Z−1 for each value of n=1, 6, 8 is obtained based on a respective value according to:

| n | value |
|---|---|
| 1 | 208 |
| 6 | 141 |
| 8 | 174 | for m=28, the submatrix arranged in rows mZ to (m+1)Z−1 and in columns nZ to (n+1)Z−1 for each value of n=0, 4, 19, 21 is obtained based on a respective value according to:

| n | value |
|---|---|
| 0 | 146 |
| 4 | 153 |
| 19 | 217 |
| 21 | 114 | for m=29, the submatrix arranged in rows mZ to (m+1)Z−1 and in columns nZ to (n+1)Z−1 for each value of n=1, 14, 18, 25 is obtained based on a respective value according to:

| n | value |
|---|---|
| 1 | 150 |
| 14 | 11 |
| 18 | 53 |
| 25 | 68 | for m=30, the submatrix arranged in rows mZ to (m+1)Z−1 and in columns nZ to (n+1)Z−1 for each value of n=0, 10, 13, 24 is obtained based on a respective value according to:

| n | value |
|---|---|
| 0 | 34 |
| 10 | 130 |
| 13 | 210 |
| 24 | 123 | for m=31, the submatrix arranged in rows mZ to (m+1)Z−1 and in columns nZ to (n+1)Z−1 for each value of n=1, 7, 22, 25 is obtained based on a respective value among {175, 49, 177, 128},

| n | value |
|---|---|
| 1 | 175 |
| 7 | 49 |
| 22 | 177 |
| 25 | 128 | for m=32, the submatrix arranged in rows mZ to (m+1)Z−1 and in columns nZ to (n+1)Z−1 for each value of n=0, 12, 14, 24 is obtained based on a respective value according to:

| n | value |
|---|---|
| 0 | 192 |
| 12 | 209 |
| 14 | 58 |
| 24 | 30 | for m=33, the submatrix arranged in rows mZ to (m+1)Z−1 and in columns nZ to (n+1)Z−1 for each value of n=1, 2, 11, 21 is obtained based on a respective value according to:

| n | value |
|---|---|
| 1 | 114 |
| 2 | 49 |
| 11 | 161 |
| 21 | 137 | for m=34, the submatrix arranged in rows mZ to (m+1)Z−1 and in columns nZ to (n+1)Z−1 for each value of n=0, 7, 15, 17 is obtained based on a respective value according to:

| n | value |
|---|---|
| 0 | 82 |
| 7 | 186 |

| n | value |
|---|---|
| 15 | 68 |
| 17 | 150 | for m=35, the submatrix arranged in rows mZ to (m+1)Z−1 and in columns nZ to (n+1)Z−1 for each value of n=1, 6, 12, 22 is obtained based on a respective value according to:

| n | value |
|---|---|
| 1 | 192 |
| 6 | 173 |
| 12 | 26 |
| 22 | 187 | for m=36, the submatrix arranged in rows mZ to (m+1)Z−1 and in columns nZ to (n+1)Z−1 for each value of n=0, 14, 15, 18 is obtained based on a respective value according to:

| n | value |
|---|---|
| 0 | 222 |
| 14 | 157 |
| 15 | 0 |
| 18 | 6 | for m=37, the submatrix arranged in rows mZ to (m+1)Z−1 and in columns nZ to (n+1)Z−1 for each value of n=1, 13, 23 is obtained based on a respective value according to:

| n | value |
|---|---|
| 1 | 81 |
| 13 | 195 |
| 23 | 138 | for m=38, the submatrix arranged in rows mZ to (m+1)Z−1 and in columns nZ to (n+1)Z−1 for each value of n=0, 9, 10, 12 is obtained based on a respective value according to:

| n | value |
|---|---|
| 0 | 123 |
| 9 | 90 |
| 10 | 73 |
| 12 | 10 | for m=39, the submatrix arranged in rows mZ to (m+1)Z−1 and in columns nZ to (n+1)Z−1 for each value of n=1, 3, 7, 19 is obtained based on a respective value according to:

| n | value |
|---|---|
| 1 | 12 |
| 3 | 77 |
| 7 | 49 |
| 19 | 114 | for m=40, the submatrix arranged in rows mZ to (m+1)Z−1 and in columns nZ to (n+1)Z−1 for each value of n=0, 8, 17 is obtained based on a respective value according to:

| n | value |
|---|---|
| 0 | 67 |
| 8 | 45 |
| 17 | 96 | for m=41, the submatrix arranged in rows mZ to (m+1)Z−1 and in columns nZ to (n+1)Z−1 for each value of n=1, 3, 9, 18 is obtained based on a respective value according to:

| n | value |
|---|---|
| 1 | 23 |
| 3 | 215 |
| 9 | 60 |
| 18 | 167 | for m=42, the submatrix arranged in rows mZ to (m+1)Z−1 and in columns nZ to (n+1)Z−1 for each value of n=0, 4, 24 is obtained based on a respective value according to:

| n | value |
|---|---|
| 0 | 114 |
| 4 | 91 |
| 24 | 78 | for m=43, the submatrix arranged in rows mZ to (m+1)Z−1 and in columns nZ to (n+1)Z−1 for each value of n=1, 16, 18, 25 is obtained based on a respective value according to:

| n | value |
|---|---|
| 1 | 206 |
| 16 | 22 |
| 18 | 134 |
| 25 | 161 | for m=44, the submatrix arranged in rows mZ to (m+1)Z−1 and in columns nZ to (n+1)Z−1 for each value of n=0, 7, 9, 22 is obtained based on a respective value according to:

| n | value |
|---|---|
| 0 | 84 |
| 7 | 4 |
| 9 | 9 |
| 22 | 12 | for m=45, the submatrix arranged in rows mZ to (m+1)Z−1 and in columns nZ to (n+1)Z−1 for each value of n=1, 6, 10 is obtained based on a respective value according to:

| n | value |
|---|-------|
| 1 | 184 |
| 6 | 121 |
| 10 | 29. |

5. The method according to claim 4, wherein for each value of m=5, . . . ,45, the submatrix arranged in rows mZ to (m+1)Z−1 and in columns nZ to (n+1)Z−1 of the parity check matrix is obtained further based on a value of Z.

6. The method according to claim 1, wherein the parity check matrix has at least 46Z rows and 68Z columns, and wherein for m=5, . . . , 45:

each submatrix arranged along the 41 diagonal elements of the parity check matrix in rows mZ to (m+1)Z−1 and in columns (m+22)Z−1 to (m+23)Z−1 (m+22)Z to (m+23)Z is an un-shifted identity matrix of size Z×Z, and each submatrix except for those along the 41 diagonal elements is an all-zero matrix of size Z×Z.

7. The method according to claim 1, wherein generating the encoded data, by the transmitting device, based on encoding the information with the determined parity check matrix comprises:

generating, based on the information and the parity check matrix, a plurality of parity bits $\vec{p}$ that satisfy:

$$H \cdot (\vec{x} \; \vec{p})^T = 0,$$

where H is the parity check matrix, and $\vec{x}$ is the information.

8. The method according to claim 1, wherein for each value of m=0, . . . ,4, the submatrix arranged in rows mZ to (m+1)Z−1 and in columns nZ to (n+1)Z−1 of the parity check matrix is equal to a circularly column-shifted identity matrix of size Z×Z that is circularly column-shifted to the right.

9. The method according to claim 1, wherein the Z of each submatrix is related to a size of the information that is encoded by the transmitting device.

10. The method according to claim 9, wherein the Z represents a lifting value that is any one of 7, 14, 28, 56, 112, or 224, and wherein the size of the information is 22 times Z.

11. The method according to claim 1, further comprising:

determining a base matrix of size at least 5×27 in which an element at location (m, n) of the base matrix indicates whether the submatrix in rows mZ to (m+1)Z−1 and in columns nZ to (n+1)Z−1 of the parity check matrix is equal to the circularly column-shifted identity matrix of size Z×Z that is circularly column-shifted to the right.

12. A transmitting device configured to encode, based on a parity check matrix of a low-density parity-check code, information for transmission over a communication channel, the transmitting device comprising:

a transceiver;

at least one processor; and at least one computer memory operably connectable to the at least one processor and storing instructions that, when executed, cause the at least one processor to perform operations comprising:

determining the parity check matrix comprising a plurality of submatrices that each have dimension Z×Z for a non-negative integer Z, wherein among the plurality of submatrices:

for m=0, the submatrix arranged in rows mZ to (m+1)Z−1 and in columns nZ to (n+1)Z−1 for each value of n=0, 1, 2, 3, 5, 6, 9, 10, 11, 12, 13, 15, 16, 18, 19, 20, 21, 22, 23 is obtained based on a respective value according to:

| n | value |
|---|-------|
| 0 | 223 |
| 1 | 16 |
| 2 | 94 |
| 3 | 91 |
| 5 | 74 |
| 6 | 10 |
| 9 | 0 |
| 10 | 205 |
| 11 | 216 |
| 12 | 21 |
| 13 | 215 |
| 15 | 14 |
| 16 | 70 |
| 18 | 141 |
| 19 | 198 |
| 20 | 104 |
| 21 | 81 |
| 22 | 1 |
| 23 | 0 | for m=1, the submatrix arranged in rows mZ to (m+1)Z−1 and in columns nZ to (n+1)Z−1 for each value of n=0, 2, 3, 4, 5, 7, 8, 9, 11, 12, 14, 15, 16, 17, 19, 21, 22, 23, 24 is obtained based on a respective value according to:

| n | value |
|---|-------|
| 0 | 141 |
| 2 | 45 |
| 3 | 151 |
| 4 | 46 |
| 5 | 119 |
| 7 | 157 |
| 8 | 133 |
| 9 | 87 |
| 11 | 206 |
| 12 | 93 |
| 14 | 79 |
| 15 | 9 |
| 16 | 118 |
| 17 | 194 |
| 19 | 31 |
| 21 | 187 |
| 22 | 0 |
| 21 | 0 |
| 24 | 0 | for m=2, the submatrix arranged in rows mZ to (m+1)Z−1 and in columns nZ to (n+1)Z−1 for each value of n=0, 1, 2, 4, 5, 6, 7, 8, 9, 10, 13, 14, 15, 17, 18, 19, 20, 24, 25 is obtained based on a respective value according to:

| n | value |
|---|-------|
| 0 | 207 |
| 1 | 203 |
| 2 | 31 |
| 4 | 176 |
| 5 | 180 |
| 6 | 186 |

-continued

| n | value |
|---|---|
| 7 | 95 |
| 8 | 153 |
| 9 | 177 |
| 10 | 70 |
| 13 | 77 |
| 14 | 214 |
| 15 | 77 |
| 17 | 198 |
| 18 | 117 |
| 19 | 223 |
| 20 | 90 |
| 24 | 0 |
| 25 | 0 | for m=3, the submatrix arranged in rows mZ to (m+1)Z−1 and in columns nZ to (n+1)Z−1 for each value of n=0, 1, 3, 4, 6, 7, 8, 10, 11, 12, 13, 14, 16, 17, 18, 20, 21, 22, 25 is obtained based on a respective value according to:

| n | value |
|---|---|
| 0 | 201 |
| 1 | 18 |
| 3 | 165 |
| 4 | 5 |
| 6 | 45 |
| 7 | 142 |
| 8 | 16 |
| 10 | 34 |
| 11 | 155 |
| 12 | 213 |
| 13 | 147 |
| 14 | 69 |
| 16 | 96 |
| 17 | 74 |
| 18 | 99 |
| 20 | 30 |
| 21 | 158 |
| 22 | 1 |
| 25 | 0 | for m=4, the submatrix arranged in rows mZ to (m+1)Z−1 and in columns nZ to (n+1)Z−1 for each value of n=0, 1, 26 is obtained based on a respective value according to:

| n | value |
|---|---|
| 0 | 170 |
| 1 | 10 |
| 26 | 0 | generating encoded data based on encoding the information with the determined parity check matrix; and
transmitting, through the transceiver, the encoded data over the communication channel.

13. The transmitting device according to claim 12, wherein for each value of m=0, . . . , 4, the submatrix arranged in rows mZ to (m+1)Z−1 and in columns nZ to (n+1)Z−1 of the parity check matrix is obtained further based on a value of the non-negative integer Z.

14. The transmitting device according to claim 13, wherein for each value of m=0, . . . ,4, the submatrix arranged in rows mZ to (m+1)Z−1 and in columns nZ to (n+1)Z−1 of the parity check matrix is equal to a circularly column-shifted identity matrix of size Z×Z that is circularly column-shifted to the right.

15. The transmitting device according to claim 13, wherein the Z of each submatrix is related to a size of the information that is encoded by the transmitting device.

16. The transmitting device according to claim 12, wherein
for m=0, the submatrix arranged in rows mZ to (m+1)Z−1 and in columns nZ to (n+1)Z−1 of the parity check matrix for each value of n other than 0, 1, 2, 3, 5, 6, 9, 10, 11, 12, 13, 15, 16, 18, 19, 20, 21, 22, 23 is equal to an all-zero matrix of size Z×Z,
for m=1, the submatrix arranged in rows mZ to (m+1)Z−1 and in columns nZ to (n+1)Z−1 of the parity check matrix for each value of n other than 0, 2, 3, 4, 5, 7, 8, 9, 11, 12, 14, 15, 16, 17, 19, 21, 22, 23, 24 is equal to an all-zero matrix of size Z×Z,
for m=2, the submatrix arranged in rows mZ to (m+1)Z−1 and in columns nZ to (n+1)Z−1 of the parity check matrix for each value of n other than 0, 1, 2, 4, 5, 6,7, 8, 9, 10, 13, 14, 15, 17, 18, 19, 20, 24, 25 is equal to an all-zero matrix of size Z×Z,
for m=3, the submatrix arranged in rows mZ to (m+1)Z−1 and in columns nZ to (n+1)Z−1 of the parity check matrix for each value of n other than 0, 1, 3, 4, 6, 7, 8, 10, 11, 12, 13, 14, 16, 17, 18, 20, 21, 22, 25 is equal to an all-zero matrix of size Z×Z, and
for m=4, the submatrix arranged in rows mZ to (m+1)Z−1 and in columns nZ to (n+1)Z−1 of the parity check matrix for each value of n—other than 0, 1, 26 is equal to an all-zero matrix of size Z×Z.

17. The transmitting device according to claim 12, wherein the parity check matrix has 46Z rows, and
wherein:
for m=5, the submatrix arranged in rows mZ to (m+1)Z−1 and in columns nZ to (n+1)Z−1 for each value of n=0, 1, 3, 12, 16, 21, 22 is obtained based on a respective value according to:

| n | value |
|---|---|
| 0 | 164 |
| 1 | 59 |
| 3 | 86 |
| 12 | 80 |
| 16 | 182 |
| 21 | 130 |
| 22 | 153 | for m=6, the submatrix arranged in rows mZ to (m+1)Z−1 and in columns nZ to (n+1)Z−1 for each value of n=0, 6, 10, 11, 13, 17, 18, 20 is obtained based on a respective value according to:

| n | value |
|---|---|
| 0 | 158 |
| 6 | 119 |
| 10 | 113 |
| 11 | 21 |
| 13 | 63 |
| 17 | 51 |
| 18 | 136 |
| 20 | 116 | for m=7, the submatrix arranged in rows mZ to (m+1)Z−1 and in columns nZ to (n+1)Z−1 for each value of n=0,1, 4, 7, 8,14 is obtained based on a respective value according to:

| n | value |
|---|---|
| 0 | 17 |
| 1 | 76 |
| 4 | 104 |
| 7 | 100 |
| 8 | 150 |
| 14 | 158 | for m=8, the submatrix arranged in rows mZ to (m+1)Z−1 and in columns nZ to (n+1)Z−1 for each value of n=0, 1, 3, 12, 16, 19, 21, 22, 24 is obtained based on a respective value according to:

| n | value |
|---|---|
| 0 | 33 |
| 1 | 95 |
| 3 | 4 |
| 12 | 217 |
| 16 | 204 |
| 19 | 39 |
| 21 | 58 |
| 22 | 44 |
| 24 | 201 | for m=9, the submatrix arranged in rows mZ to (m+1)Z−1 and in columns nZ to (n+1)Z−1 for each value of n=0, 1, 10, 11, 13, 17, 18, 20 is obtained based on a respective value according to:

| n | value |
|---|---|
| 0 | 9 |
| 1 | 37 |
| 10 | 213 |
| 11 | 105 |
| 13 | 89 |
| 17 | 185 |
| 18 | 109 |
| 20 | 218 | for m=10, the submatrix arranged in rows mZ to (m+1)Z−1 and in columns nZ to (n+1)Z−1 for each value of n=1, 2, 4, 7, 8, 14 is obtained based on a respective value according to: {82, 165, 174, 19, 194, 103},

| n | value |
|---|---|
| 1 | 82 |
| 2 | 165 |
| 4 | 174 |
| 7 | 19 |
| 8 | 194 |
| 14 | 103 | for m=11, the submatrix arranged in rows mZ to (m+1)Z−1 and in columns nZ to (n+1)Z−1 for each value of n=0, 1, 12, 16, 21, 22, 23 is obtained based on a respective value according to:

| n | value |
|---|---|
| 0 | 52 |
| 1 | 11 |
| 12 | 2 |
| 16 | 35 |
| 21 | 32 |

-continued

| n | value |
|---|---|
| 22 | 84 |
| 23 | 201 | for m=12, the submatrix arranged in rows mZ to (m+1)Z−1 and in columns nZ to (n+1)Z−1 for each value of n=0, 1, 10, 11, 13, 18 is obtained based on a respective value according to:

| n | value |
|---|---|
| 0 | 142 |
| 1 | 175 |
| 10 | 136 |
| 11 | 3 |
| 13 | 28 |
| 18 | 182 | for m=13, the submatrix arranged in rows mZ to (m+1)Z−1 and in columns nZ to (n+1)Z−1 for each value of n=0, 3, 7, 20, 23 is obtained based on a respective value according to:

| n | value |
|---|---|
| 0 | 81 |
| 3 | 56 |
| 7 | 72 |
| 20 | 217 |
| 23 | 78 | for m=14, the submatrix arranged in rows mZ to (m+1)Z−1 and in columns nZ to (n+1)Z−1 for each value of n=0, 12, 15, 16, 17, 21 is obtained based on a respective value according to:

| n | value |
|---|---|
| 0 | 14 |
| 12 | 175 |
| 15 | 211 |
| 16 | 191 |
| 17 | 51 |
| 21 | 43 | for m=15, the submatrix arranged in rows mZ to (m+1)Z−1 and in columns nZ to (n+1)Z−1 for each value of n=0, 1, 10, 13, 18, 25 is obtained based on a respective value according to:

| n | value |
|---|---|
| 0 | 90 |
| 1 | 120 |
| 10 | 131 |
| 13 | 209 |
| 18 | 209 |
| 25 | 81 | for m=16, the submatrix arranged in rows mZ to (m+1)Z−1 and in columns nZ to (n+1)Z−1 for each value of n=1, 3, 11, 20, 22 is obtained based on a respective value according to:

| n | value |
|---|---|
| 1 | 154 |
| 3 | 164 |
| 11 | 43 |
| 20 | 189 |
| 22 | 101 | for m=17, the submatrix arranged in rows mZ to (m+1)Z−1 and in columns nZ to (n+1)Z−1 for each value of n=0, 14, 16, 17, 21 is obtained based on a respective value according to:

| n | value |
|---|---|
| 0 | 56 |
| 14 | 110 |
| 16 | 200 |
| 17 | 63 |
| 21 | 4 | for m=18, the submatrix arranged in rows mZ to (m+1)Z−1 and in columns nZ to (n+1)Z−1 for each value of n=1, 12, 13, 18, 19 is obtained based on a respective value according to:

| n | value |
|---|---|
| 1 | 199 |
| 12 | 110 |
| 13 | 200 |
| 18 | 143 |
| 19 | 186 | for m=19, the submatrix arranged in rows mZ to (m+1)Z−1 and in columns nZ to (n+1)Z−1 for each value of n=0, 1, 7, 8, 10 is obtained based on a respective value according to:

| n | value |
|---|---|
| 0 | 8 |
| 1 | 6 |
| 7 | 103 |
| 8 | 198 |
| 10 | 8 | for m=20, the submatrix arranged in rows mZ to (m+1)Z−1 and in columns nZ to (n+1)Z−1 for each value of n=0, 3, 9, 11, 22 is obtained based on a respective value according to:

| n | value |
|---|---|
| 0 | 105 |
| 3 | 210 |
| 9 | 121 |
| 11 | 214 |
| 22 | 183 | for m=21, the submatrix arranged in rows mZ to (m+1)Z−1 and in columns nZ to (n+1)Z−1 for each value of n=1, 5, 16, 20, 21 is obtained based on a respective value according to:

| n | value |
|---|---|
| 1 | 192 |
| 5 | 131 |
| 16 | 220 |
| 20 | 50 |
| 21 | 106 | for m=22, the submatrix arranged in rows mZ to (m+1)Z−1 and in columns nZ to (n+1)Z−1 for each value of n=0, 12, 13, 17 is obtained based on a respective value according to:

| n | value |
|---|---|
| 0 | 53 |
| 12 | 0 |
| 13 | 3 |
| 17 | 148 | for m=23, the submatrix arranged in rows mZ to (m+1)Z−1 and in columns nZ to (n+1)Z−1 for each value of n=1, 2, 10, 18 is obtained based on a respective value according to:

| n | value |
|---|---|
| 1 | 88 |
| 2 | 203 |
| 10 | 168 |
| 18 | 122 | for m=24, the submatrix arranged in rows mZ to (m+1)Z−1 and in columns nZ to (n+1)Z−1 for each value of n=0, 3, 4, 11, 22 is obtained based on a respective value according to:

| n | value |
|---|---|
| 0 | 49 |
| 3 | 157 |
| 4 | 64 |
| 11 | 193 |
| 22 | 124 | for m=25, the submatrix arranged in rows mZ to (m+1)Z−1 and in columns nZ to (n+1)Z−1 for each value of n=1, 6, 7, 14 is obtained based on a respective value according to: among

| n | value |
|---|---|
| 1 | 1 |
| 6 | 166 |
| 7 | 65 |
| 14 | 81 | for m=26, the submatrix arranged in rows mZ to (m+1)Z−1 and in columns nZ to (n+1)Z−1 for each value of n=0, 2, 4, 15 is obtained based on a respective value according to:

| n | value |
|---|---|
| 0 | 107 |
| 2 | 176 |
| 4 | 212 |
| 15 | 127 | for m=27, the submatrix arranged in rows mZ to (m+1)Z−1 and in columns nZ to (n+1)Z−1 for each value of n=1, 6, 8 is obtained based on a respective value according to:

| n | value |
|---|---|
| 1 | 208 |
| 6 | 141 |
| 8 | 174 | for m=28, the submatrix arranged in rows mZ to (m+1)Z−1 and in columns nZ to (n+1)Z−1 for each value of n=0, 4, 19, 21 is obtained based on a respective value according to:

| n | value |
|---|---|
| 0 | 146 |
| 4 | 153 |
| 19 | 217 |
| 21 | 114 | for m=29, the submatrix arranged in rows mZ to (m+1)Z−1 and in columns nZ to (n+1)Z−1 for each value of n=1, 14, 18, 25 is obtained based on a respective value according to: among

| n | value |
|---|---|
| 1 | 150 |
| 14 | 11 |
| 18 | 53 |
| 25 | 68 | for m=30, the submatrix arranged in rows mZ to (m+1)Z−1 and in columns nZ to (n+1)Z−1 for each value of n=0, 10, 13, 24 is obtained based on a respective value according to:

| n | value |
|---|---|
| 0 | 34 |
| 10 | 130 |
| 13 | 210 |
| 24 | 123 | for m=31, the submatrix arranged in rows mZ to (m+1)Z−1 and in columns nZ to (n+1)Z−1 for each value of n=1, 7, 22, 25 is obtained based on a respective value among {175, 49, 177, 128},

| n | value |
|---|---|
| 1 | 175 |
| 7 | 49 |
| 22 | 177 |
| 25 | 128 | for m=32, the submatrix arranged in rows mZ to (m+1)Z−1 and in columns nZ to (n+1)Z−1 for each value of n=0, 12, 14, 24 is obtained based on a respective value according to:

| n | value |
|---|---|
| 0 | 192 |
| 12 | 209 |
| 14 | 58 |
| 24 | 30 | for m=33, the submatrix arranged in rows mZ to (m+1)Z−1 and in columns nZ to (n+1)Z−1 for each value of n=1, 2, 11, 21 is obtained based on a respective value according to:

| n | value |
|---|---|
| 1 | 114 |
| 2 | 49 |
| 11 | 161 |
| 21 | 137 | for m=34, the submatrix arranged in rows mZ to (m+1)Z−1 and in columns nZ to (n+1)Z−1 for each value of n=0, 7, 15, 17 is obtained based on a respective value according to:

| n | value |
|---|---|
| 0 | 82 |
| 7 | 186 |
| 15 | 68 |
| 17 | 150 | for m=35, the submatrix arranged in rows mZ to (m+1)Z−1 and in columns nZ to (n+1)Z−1 for each value of n=1, 6, 12, 22 is obtained based on a respective value according to:

| n | value |
|---|---|
| 1 | 192 |
| 6 | 173 |
| 12 | 26 |
| 22 | 187 | for m=36, the submatrix arranged in rows mZ to (m+1)Z−1 and in columns nZ to (n+1)Z−1 for each value of n=0, 14, 15, 18 is obtained based on a respective value according to:

| n | value |
|---|---|
| 0 | 222 |
| 14 | 157 |

-continued

| n | value |
|---|---|
| 15 | 0 |
| 18 | 6 | for m=37, the submatrix arranged in rows mZ to (m+1)Z−1 and in columns nZ to (n+1)Z−1 for each value of n=1, 13, 23 is obtained based on a respective value according to:

| n | value |
|---|---|
| 1 | 81 |
| 13 | 195 |
| 23 | 138 | for m=38, the submatrix arranged in rows mZ to (m+1)Z−1 and in columns nZ to (n+1)Z−1 for each value of n=0, 9, 10, 12 is obtained based on a respective value according to:

| n | value |
|---|---|
| 0 | 123 |
| 9 | 90 |
| 10 | 73 |
| 12 | 10 | for m=39, the submatrix arranged in rows mZ to (m+1)Z−1 and in columns nZ to (n+1)Z−1 for each value of n=1, 3, 7, 19 is obtained based on a respective value according to:

| n | value |
|---|---|
| 1 | 12 |
| 3 | 77 |
| 7 | 49 |
| 19 | 114 | for m=40, the submatrix arranged in rows mZ to (m+1)Z−1 and in columns nZ to (n+1)Z−1 for each value of n=0, 8, 17 n is obtained based on a respective value according to:

| n | value |
|---|---|
| 0 | 67 |
| 8 | 45 |
| 17 | 96 | for m=41, the submatrix arranged in rows mZ to (m+1)Z−1 and in columns nZ to (n+1)Z−1 for each value of n=1, 3, 9, 18 is obtained based on a respective value according to:

| n | value |
|---|---|
| 1 | 23 |
| 3 | 215 |
| 9 | 60 |
| 18 | 167 | for m=42, the submatrix arranged in rows mZ to (m+1)Z−1 and in columns nZ to (n+1)Z−1 for each value of n=0, 4, 24 is obtained based on a respective value according to:

| n | value |
|---|---|
| 0 | 114 |
| 4 | 91 |
| 24 | 78 | for m=43, the submatrix arranged in rows mZ to (m+1)Z−1 and in columns nZ to (n+1)Z−1 for each value of n=1, 16, 18, 25 is obtained based on a respective value according to:

| n | value |
|---|---|
| 1 | 206 |
| 16 | 22 |
| 18 | 134 |
| 25 | 161 | for m=44, the submatrix arranged in rows mZ to (m+1)Z−1 and in columns nZ to (n+1)Z−1 for each value of n=0, 7, 9, 22 is obtained based on a respective value according to:

| n | value |
|---|---|
| 0 | 84 |
| 7 | 4 |
| 9 | 9 |
| 22 | 12 | for m=45, the submatrix arranged in rows mZ to (m+1)Z−1 and in columns nZ to (n+1)Z−1 for each value of n=1, 6, 10 is obtained based on a respective value according to:

| n | value |
|---|---|
| 1 | 184 |
| 6 | 121 |
| 10 | 29. |

18. The transmitting device according to claim 12, wherein the parity check matrix has at least 46Z rows and 68Z columns, and wherein for m=5, . . . , 45:

each submatrix arranged along the 41 diagonal elements of the parity check matrix in rows mZ to (m+1)Z−1 and in columns (m+22)Z−1 to (m+23)Z−1 (m+22)Z to (m+23)Z is an un-shifted identity matrix of size Z×Z, and each submatrix except for those along the 41 diagonal elements is an all-zero matrix of size Z×Z.

19. The transmitting device according to claim 12, wherein the Z represents a lifting value that is any one of 7, 14, 28, 56, 112, or 224, and wherein the size of the information is 22 times Z.

* * * * *